(12) United States Patent
Mi et al.

(10) Patent No.: US 11,187,758 B2
(45) Date of Patent: Nov. 30, 2021

(54) METHODS AND CIRCUITRY FOR FAULT DETECTION AND AUTOMATIC EQUALIZERS FOR BATTERY PACKS

(71) Applicant: San Diego State University Research Foundation, San Diego, CA (US)

(72) Inventors: Chunting Mi, San Diego, CA (US); Fei Lu, San Diego, CA (US); Bing Xia, Sparks, NV (US); Yunlong Shang, La Mesa, CA (US)

( * ) Notice: Subject to any disclaimer, the term of this patent is extended or adjusted under 35 U.S.C. 154(b) by 252 days.

(21) Appl. No.: 16/340,135

(22) PCT Filed: Oct. 19, 2017

(86) PCT No.: PCT/US2017/057430
§ 371 (c)(1),
(2) Date: Apr. 8, 2019

(87) PCT Pub. No.: WO2018/075793
PCT Pub. Date: Apr. 26, 2018

(65) Prior Publication Data
US 2019/0310321 A1    Oct. 10, 2019

Related U.S. Application Data

(63) Continuation of application No. PCT/US2017/057430, filed on Oct. 19, 2017.
(Continued)

(51) Int. Cl.
*G01R 31/396* (2019.01)
*G01R 31/44* (2020.01)
(Continued)

(52) U.S. Cl.
CPC ............ *G01R 31/44* (2013.01); *B60L 3/0046* (2013.01); *B60L 58/22* (2019.02); *G01R 31/36* (2013.01);
(Continued)

(58) Field of Classification Search
CPC .. G01R 31/36; G01R 31/362; G01R 31/3679; G01R 31/396; G01R 31/3835;
(Continued)

(56) References Cited

U.S. PATENT DOCUMENTS 6,150,795 A    11/2000 Kutkut et al.
2014/0152261 A1    6/2014 Yamauchi et al.
(Continued)

OTHER PUBLICATIONS

He, Z et al., "Adaptive State of Charge Estimation for Li-Ion Batteries based on an Unscented Kalman Filter with an Enhanced Battery Model", Energies, Aug. 12, 2013, ISSN 1996-1073, pp. 4134-4151, doi:10.3390/en6084134.
(Continued)

*Primary Examiner* — Paul Dinh

(57) ABSTRACT

The present disclosure is directed to method of automatic circuit fault detection. The method includes inputting a common periodic wave voltage to each of a plurality of battery cells of a battery pack. Recursively calculated correlation coefficients for each neighboring pair of the battery cells are used to determine whether a common battery cell of two neighboring pairs is faulty. The disclosure further describes equalizers for multi-cell battery packs and series-connected battery strings. The equalizers can include a coupling capacitor comprising a plurality of small plates coupled between the two series-connected metal-oxide-semiconductor field-effect transistors (MOSFETs) connected to each battery cell, and a larger plate, wherein the larger plate is commonly coupled to all of the small plates. A plurality of battery string groups can be equalized, where each cell includes one transformer winding and a MOSFET. The MOSFETs are driven using one pair of complementary pulse width modulation signals.

6 Claims, 20 Drawing Sheets

Related U.S. Application Data

(60) Provisional application No. 62/409,881, filed on Oct. 19, 2016, provisional application No. 62/426,511, filed on Nov. 26, 2016, provisional application No. 62/436,447, filed on Dec. 20, 2016.

(51) Int. Cl.
| | |
|---|---|
| *G01R 31/3835* | (2019.01) |
| *G01R 31/371* | (2019.01) |
| *B60L 58/22* | (2019.01) |
| *B60L 3/00* | (2019.01) |
| *H02J 7/00* | (2006.01) |
| *G01R 31/36* | (2020.01) |

(52) U.S. Cl.
CPC ....... *G01R 31/371* (2019.01); *G01R 31/3835* (2019.01); *G01R 31/396* (2019.01); *H02J 7/0014* (2013.01); *Y02T 10/70* (2013.01)

(58) Field of Classification Search
CPC ..... G01R 31/371; B60L 58/22; B60L 3/0046; B60L 58/24; H02J 7/0014; Y02T 10/70
USPC ......................................................... 320/118
See application file for complete search history.

(56) References Cited

U.S. PATENT DOCUMENTS

| | | | |
|---|---|---|---|
| 2014/0244193 A1 | 8/2014 | Balasingam et al. | |
| 2017/0067965 A9* | 3/2017 | Gach | G01R 31/36 |
| 2019/0033391 A1* | 1/2019 | Iwane | G01R 31/396 |

OTHER PUBLICATIONS

Xia, Bing, "Self-redundant Real-time Fault Diagnosis of Battery Systems in Electrified Vehicles", UC San Diego Electronic Theses and Dissertations, https://escholarship.org/uc/item/8sj0576z, 2017.

* cited by examiner

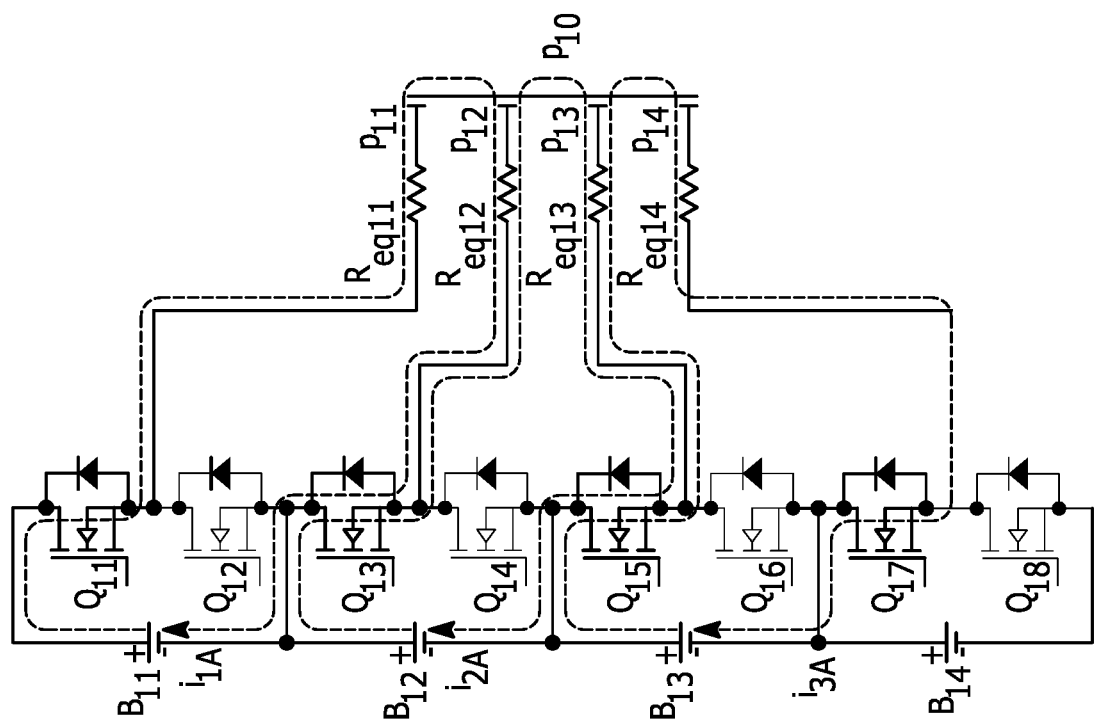
FIG. 12A.2
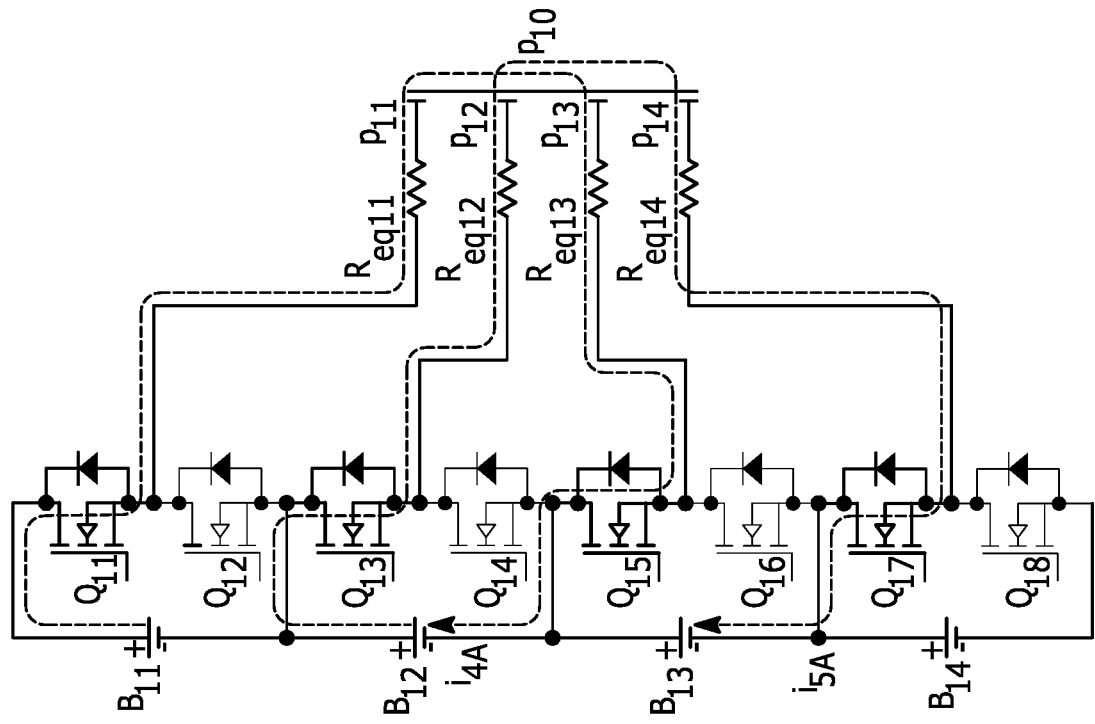
FIG. 12A.1

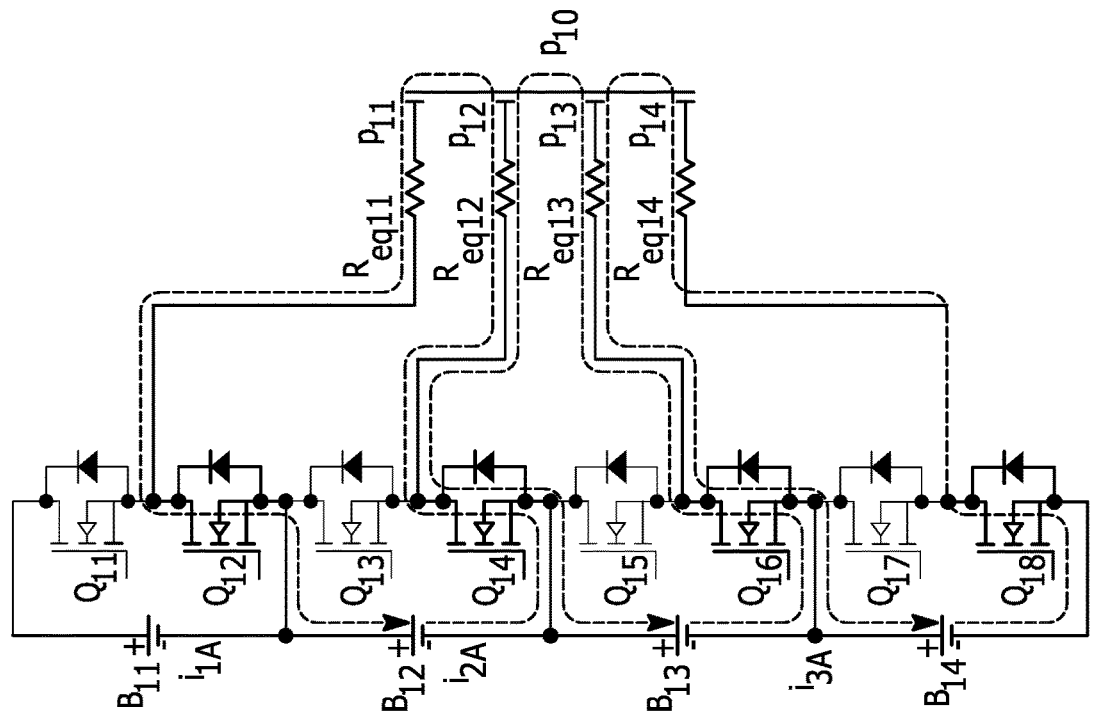
FIG. 12B.1
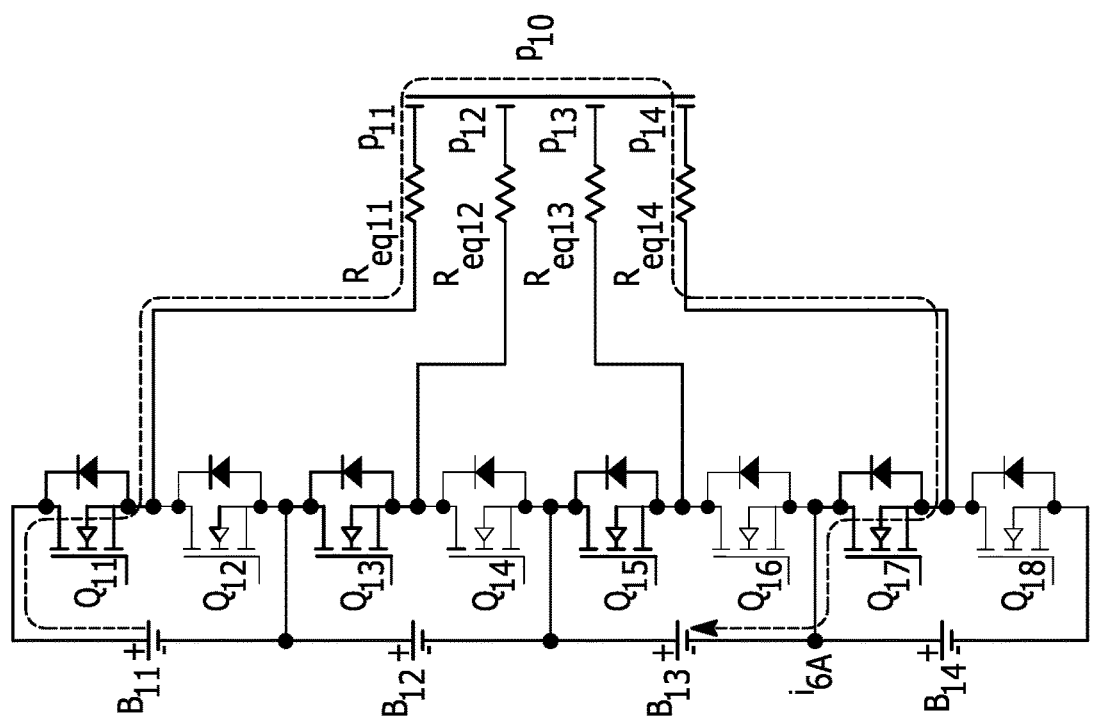
FIG. 12A.3

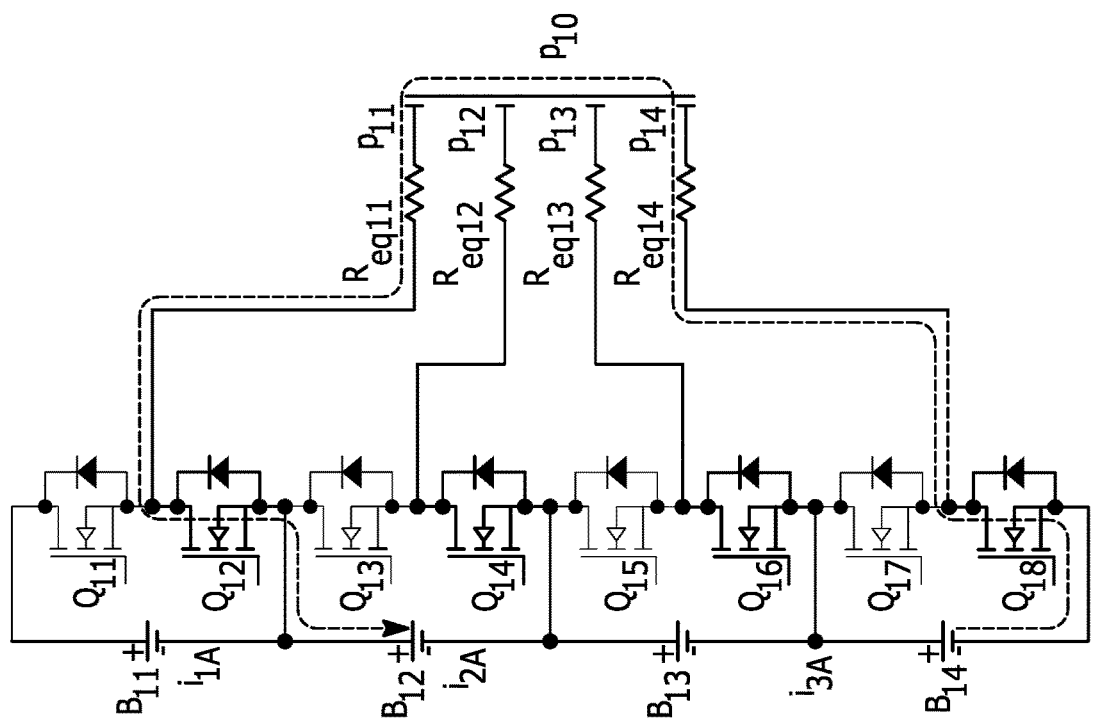
FIG. 12B.3
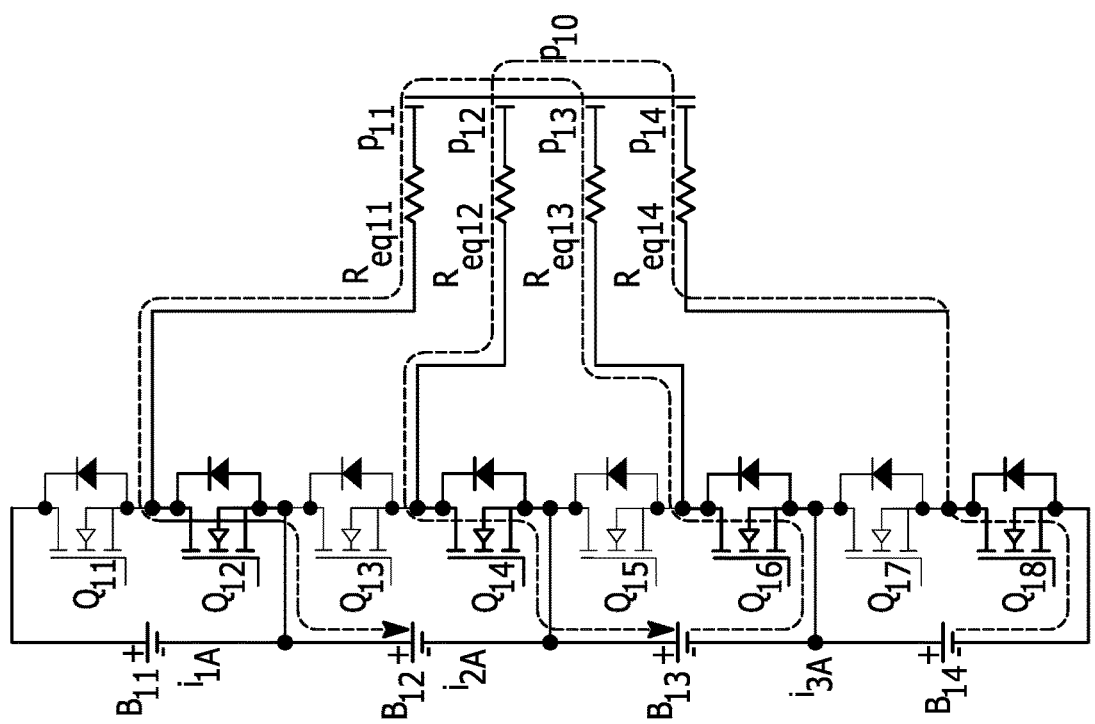
FIG. 12B.2

METHODS AND CIRCUITRY FOR FAULT DETECTION AND AUTOMATIC EQUALIZERS FOR BATTERY PACKS

RELATED APPLICATIONS

This application is a National Phase Entry of International App. No. PCT/US2017/057430, entitled "Methods and Circuitry for Fault Detection and Automatic Equalizers for Battery Packs", filed Oct. 19, 2017 and which claims priority to U.S. Provisional App. No. 62/409,881, entitled "A Correlation Based Fault Detection Method for Short Circuits in Battery Packs," filed Oct. 20, 2016; U.S. Provisional App. No. 62/426,511, entitled "A Switched-Coupling Capacitor Equalizer for Series-Connected Battery Strings," filed Nov. 26, 2016; and U.S. Provisional App. No. 62/436,447 entitled "An Automatic Equalizer Based on Forward and Flyback Conversion for Series-Connected Battery Strings," filed Dec. 20, 2016, all of which are incorporated herein by reference in their entirety.

FIELD

Embodiments of the invention relate to the field of battery pack management; and more specifically, to methods and circuits for battery cell fault detection and automatic equalization of battery cells in a battery pack.

BACKGROUND

Fault Detection

The prevailing applications of lithium-ion batteries in various embodiments, including electrified vehicles (EVs) for example, provide competitive energy and power performances. However, there are potential safety concerns of lithium-ion batteries, which has diminished their rapid expansion. The demand of safe battery operation gives rise to battery management systems (BMS). The BMS in an EV, for example, monitors the voltage, current and temperature of a battery pack, estimates the essential states of the cells, and maintains the safe and efficient operation of the energy storage system. A qualified BMS should be able to flag warnings when any of the cell is in abuse condition and activate the corresponding mitigation methods. The abuse behaviors cover a wide variety of conditions which can be grouped into four categories based on the electric features, namely, over charge, over discharge, external short circuit and internal short circuit.

Compared with the over-charge/discharge faults, the short circuit faults are more hazardous. The external short circuit fault induces abnormally high heat generation rate, which may easily initiate the thermal runaway. The thermal runaway describes the heat propagation process within the battery pack, There the exothermic side reaction of one cell failure influences the safe operation of surrounding cells, and further triggers the chain exothermic reactions. Thereafter, the heat builds up rapidly and finally results in fire or explosion. Different from the external short circuit, the internal short circuit is usually caused by manufacturing defects or mechanical failure. As the short area in the separator emerges, an internal current path is formed. The local high current rate elevates the local temperature. The high temperature first forces the closure of separators with a shutdown function. However, if the heat is not dissipated well, an even higher temperature will melt the separator and eventually trigger thermal runaway.

Conventional approaches specifically regarding short circuits can be classified into two groups: a) threshold based methods; and b) model based methods. The external short circuit fault can be detected by comparing the direct sensor measurements with the threshold in current increase, voltage drop and temperature rise. The limitation of this method is that a fault may occur without triggering the threshold. If the resistance in the short loop is moderate such that the current, voltage and temperature does not go beyond the preset limit within a short period of time, the fault will not be flagged at the occurrence. To a certain extent, the detection of the internal short circuit is more complicated. At the initial phase of internal short circuit fault, when the damage on the separator leads to an internal short, and the local heat results in the separator shutdown, the terminal voltage of the fault cell will first drop and then recover.

If a simple threshold based method is applied, it may not capture the abnormal voltage pattern. Since the current flows internally, it cannot be recorded by the current sensor either. To make it even worse, the fast short may not cause adequate increase of the cell surface temperature. Therefore, the threshold based methods may not satisfactorily function. In fact, there have been situations where a voltage drop recovery was recorded by the onboard BMS, but the BMS failed to flag any warning at the initial phase of failure. When the fault was recognized minutes later, a fire had already started.

An improved threshold based method sets the threshold for maximum voltage differences within a battery pack, instead of the absolute voltage value for each cell. This method was originally designed for imbalanced state detection, but can be adopted to short circuit detection as well. In this method, the threshold of voltage difference should be chosen with special care. If the value is too large, it cannot capture the voltage drop, whereas if the value is too small, it can easily lead to false positive detection due to inconsistencies in battery states and parameters. The model based method tries to predict the battery output/state from the input in a feedback manner. The model output/state is compared with the battery output; state. If the residue is above a threshold, a fault is flagged. This method gives more reliable detection than the threshold based method; however, it requires substantial effort in accurate modeling and testing. But, this method is still vulnerable to cell inconsistencies, unless the online parameter estimation is implemented for every single cell in the series pack which is prohibitive in many applications.

Battery Cell Equalizing

Rechargeable batteries are widely applied in uninterruptible power supplies, artificial satellites, and EVs as energy storage systems. Due to the high energy density, low self-discharge rate, and no memory effect, lithium battery (i.e., lithium-ion, lithium polymer, or lithium iron phosphate (LiFePO4) battery) has been regarded as one of the most attractive rechargeable batteries. However, the terminal voltage of a single lithium battery cell is usually low, e.g., 3-4.2 V for lithium-ion battery cells and 2-165 V for LiFePO4 battery cells. Generally, in order to meet the load voltage and power requirements, lithium battery cells are usually connected in parallel and series to construct a battery pack. Nevertheless, there are slight differences in terms of capacity, internal resistance, and voltage among cells, which will be enlarged as the battery pack ages. Lithium batteries cannot be overcharged, which may lead to explosion or fire, and cannot be over discharged, which may degrade the characteristics of batteries. As a result, charging or discharging must be interrupted when any cell in the battery pack reaches its cutoff voltage, which does not utilize efficiently the energy storage potential of the battery pack. Therefore, battery balancing is mandatory for series-connected battery packs to maximize the available operating range and to extend battery life.

FIGS. 1(a)-(c) show a conventional switched-capacitor (SC) equalizer for four battery cells, in various operation states. Many balancing circuits have been in recent years, which can be classified into two groups: the passive equalizers; and the active equalizers.

The passive methods employ a resistor connected as a shunt for each cell to drain excess energy from the high voltage cells. Small size, low cost, and easy implementation are among the advantages of this method. However, energy dissipation and heat problems are critical disadvantages. To overcome these drawbacks, active cell balancing circuits utilizing capacitors, inductors, or transformers have been studied.

Active balancing methods employ non-dissipative energy-shuttling elements to move energy from strong cells to weak ones. Among these active cell balancing methods, the SC equalizer is promising due to the small size, ease of control, and ease of implementation. As shown in FIG. 1(a), one capacitor is employed for every two adjacent cells to shift energy between two adjacent cells. FIGS. 1(b) and (c) show the two operation states of the SC equalizer. By switching the capacitors back and forth, the equalizer brings the cell voltages to an almost equal value. However, energy is only transferred from one cell to its adjacent cell through one capacitor during one switching cycle.

FIG. 2 show the balancing paths under the assumption of $V_{B11}>V_{B12}>V_{B13}>V_{B14}$. Particularly, when the high voltage cell and the low voltage cell are on the opposite ends of the battery string, it will take a long time and many steps to balance the cell voltages. Moreover, the balancing energy would have to travel through all the cells and capacitors, resulting in a severe penalty on the balancing efficiency and balancing speed.

To increase the balancing speed, a double-tiered SC equalizer and a chain-structure of SC balancing circuit have been utilized. These methods can, to a certain extent, improve the balancing speed using additional capacitors and MOSFET switches. However, the balancing speed is still slow and the efficiency is also low as the increase of the number of the battery cells connected in series. Particularly, the equalizers are difficult to be modularized.

Equalizer design for a long battery string is very challenging, and needs to satisfy the high efficiency, ease of control, low voltage stress on MOSFETs, small size, low cost, and easy modularization. Active equalizers present a higher efficiency as they are based on energy transfer. Generally, the active methods use capacitors, inductors, transformers, or a combination thereof for transferring energy from strong cells (cells with high voltages) to weak ones (cells with low voltages), Among these topologies, transformer-based solutions have the inherent advantages of easy isolation, high efficiency, simple control, and small size. Some methods can transfer energy directly from the source cell to the target one based on flyback or forward conversion, achieving a high balancing speed. However, these equalizer needs two MOSFET switches and a transformer winding for each cell, resulting in a bulk size and high cost of the balancing system.

Moreover, the control is very complex due to the requirements of cell voltage sensing circuits and multi control signals, and the judgement of working modes. A charge equalizer has been proposed based on a modified half-bridge converter, which achieves soft switching and improves the reliability of the equalizer. However, the equalizer needs one winding and two diodes for each cell, as well as one secondary winding and two MOSFET switches for the battery pack. This system still has the disadvantages high cost and large volume. Moreover, the turns ratio is also extremely high for a long battery string, leading to a low conversion efficiency. In addition, the components in the secondary side of the transformer suffer from high voltage stress, requiring more expensive semiconductor devices, Due to energy transferred from the pack to the least charged cell, there may be repeated charging and discharging phenomenon, resulting in a low balancing efficiency and speed.

A modularized equalizer has been proposed based on flyback conversion, which does not need cell voltage monitoring circuits. The proposed method utilizes the magnetizing energy of the multi-winding transformer for the equalization among modules without the requirement of additional components, leading to a small size and low cost. However, the modularized method is not suitable for more than two battery modules.

A hierarchical active balancing architecture has been proposed, which consists of two balancing layers, i.e., the bottom layer and the top one. The bottom layer employs a buck-boost converter for every two adjacent cells, resulting in a bulk size. Moreover, energy is only transferred from one cell to the adjacent one, leading to a low balancing efficiency and speed. The top layer using a hi-winding transformer is employed to achieve the voltage equalization among battery modules.

As shown in FIG. 3, one MOSFET and one winding of the transformer are set for each cell. Only one control signal is employed for the equalizer, and energy can be automatically and directly delivered from strong cells to weak ones within the battery string. However, this method needs additional demagnetizing circuits to reset the magnetic energy stored in the transformer when the MOSFETs are turned oil A suitable capacitor is added for each winding to form a resonant LC converter with the magnetizing inductance of the transformer, resulting in the mismatching, high cost, bulk size, and complex design of equalizers.

Moreover, this equalizer only operated in the specific range of switching frequencies and duty cycles to achieve soft switching, leading to more complexity in control and design of the balancing circuits. Although the equalizer only uses one magnetic core and fewer active switches, the implementation is still complicated for a long series-connected battery string due to the mismatching, bulk size, large leakage inductance, and high complexity implementation of the multi windings.

SUMMARY

Embodiments of the present disclosure are directed to a method of automatic circuit fault detection. The method can include inputting a common periodic wave voltage to each of a plurality of battery cells of a battery pack, in series. According to certain embodiments, the periodic wave has an amplitude three times a standard deviation of a noise standard deviation, and a period smaller than a window size of the recursively calculated correlation coefficients. Then, the method can include recursively calculating a correlation coefficient for each neighboring pair of the battery cells, connected in series. Each correlation coefficient can be compared with a previously calculated corresponding correlation coefficient to determine whether any of the correlation coefficients dropped; and if the correlation coefficients of two neighboring pairs of the battery cells drop, it can be automatically determined that a common battery cell of both of the neighboring pairs is faulty.

According to various embodiments, recursively determining the correlation coefficients includes measuring voltages output at each battery cell sequentially; and shifting the measured voltages in the time domain to align with corresponding previously measured voltages. The method can further include outputting on a display the dropped correlation coefficients of the two neighboring pairs of battery cells and an indication of which battery cell is faulty.

Another embodiment is directed to an automatic switched-coupling-capacitor equalizer. The equalizer can include a plurality of battery cells connected in parallel, each connected with two series-connected metal-oxide-semiconductor field-effect transistors (MOSFETs). The equalizer can further include a coupling capacitor comprising a plurality of small plates coupled between the two series-connected MOSFETs connected to each of the plurality of battery cells, respectively, and a larger plate, wherein the larger plate is commonly coupled to all of the small plates. According to certain embodiments, all of the MOSFETs are driven using one pair of complementary pulse width modulation (PWM) signals.

Yet another embodiment is directed to automatic equalizer for series-connected battery strings, including a multi-winding transformer; and a plurality of battery string groups, each group including a plurality of battery cells, each cell including one transformer winding of the multi-winding transformer and a MOSFET. According to certain embodiments, all MOSFETs are controlled by one pair of complementary PWM signals, such that all cells in neighboring groups are controlled by complementary signals, respectively. Further, each winding within all cells of each respective group can have the same polarity, and windings with cells of each neighboring group, respectively, can have opposite polarities.

The fault detection methods and systems, as well as the equalization methods and systems can be embodiment in a variety of applications, including (but not limited to) integration within an electric vehicle, for example.

Various other features and advantages will become obvious to one of ordinary skill in the art in light of the following detailed description and drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 6($b$) shows a graph of correlation coefficients with fault detections, according to an exemplary embodiment.

FIG. 7($b$) shows a graph of an exemplary correlation coefficient with independent noise added, according to an exemplary embodiment.

FIG. 7($c$) shows a graph of an exemplary correlation coefficient with noise and a periodic wave added, according to an exemplary embodiment.

FIGS. 12($a$.1)-($a$.3) and ($b$.1)-($b$.3) show operating states I and II, respectively, of an exemplary switched-coupling-capacitor equalizer, according to an exemplary embodiment.

DESCRIPTION OF EMBODIMENTS

Figure 1C:
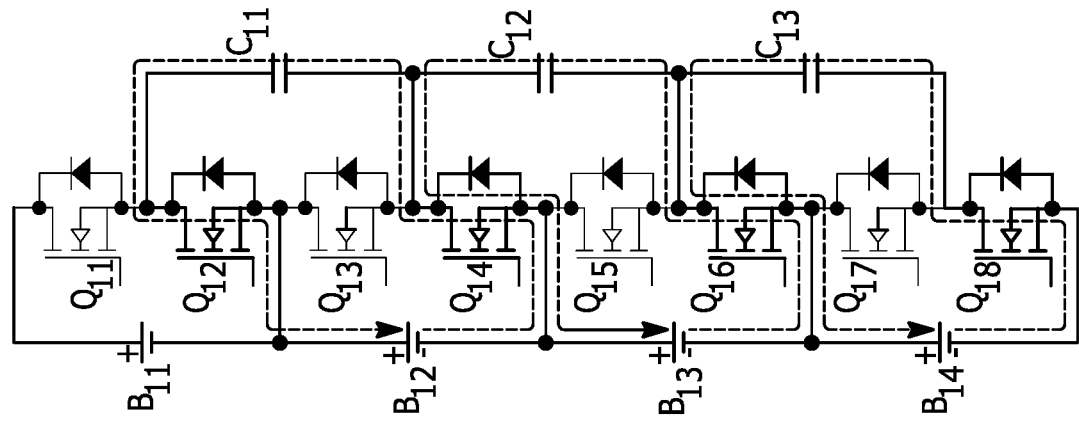
FIGS. 1($a$)-1($c$) show an example schematic, operation state I and operation state II, respectively, of a switched-capacitor equalizer, according to an exemplary embodiment.
Figure 1B:
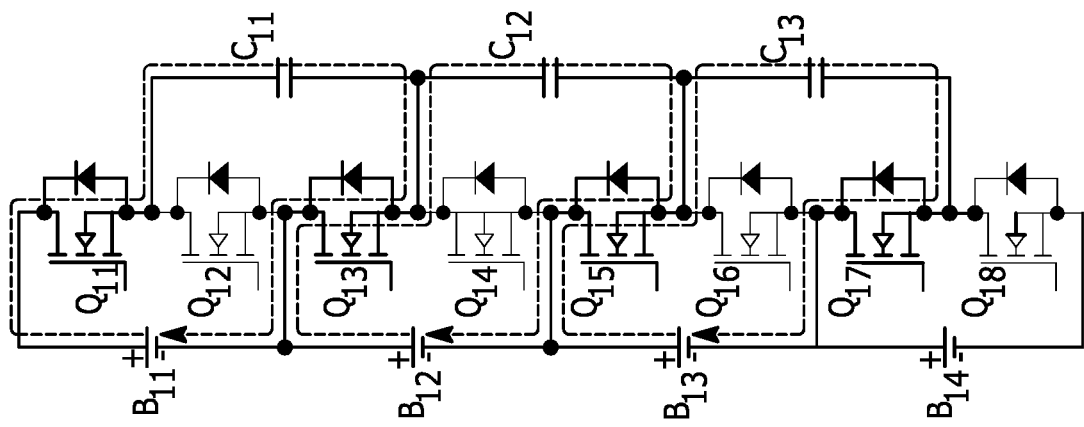
Figure 1A:
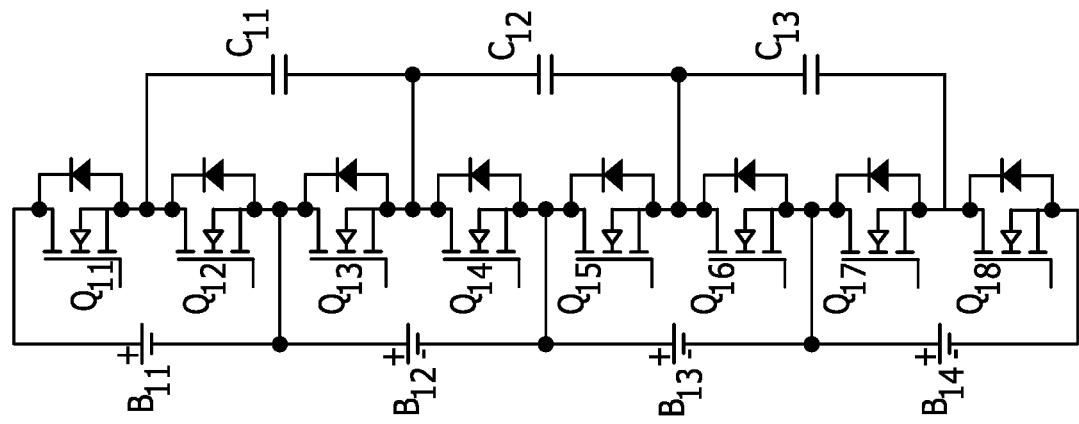
Figure 2:
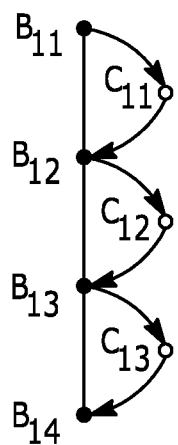
FIG. 2 is an exemplary schematic of a switched-capacitor equalizer method, according to an exemplary embodiment.
Figure 3:
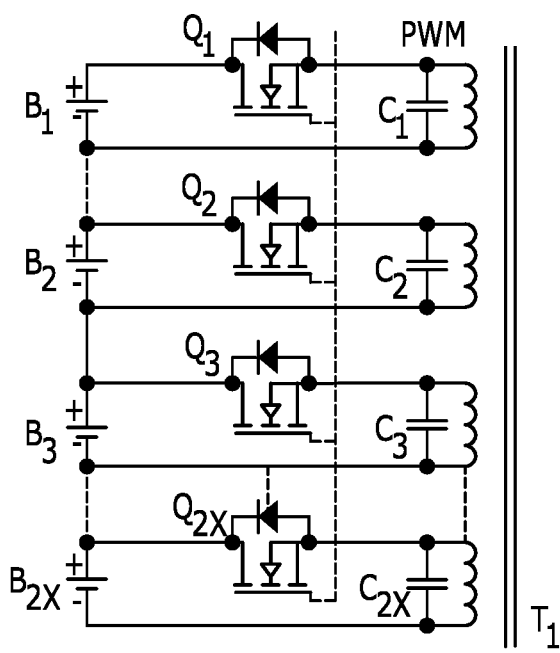
FIG. 3 is an exemplary equalizer based on forward conversion, according to an exemplary embodiment.

In the following description, numerous specific details are set forth. However, it is understood that embodiments of the invention may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Automatic Fault Detection

Generally, the existing fault diagnosis methods are redundancy based, which can be further divided into hardware redundancy and analytical redundancy. The key idea is to compare the system state/output with the state/output of redundancy systems, and flag a fault when the residue is not reasonably small. The hardware redundancy utilizes duplicative real systems to provide comparison. The common drawbacks of the hardware redundancy are its increase in hardware cost and system complexity, making it impractical for battery systems. The analytical redundancy constructs a mathematical system model and compares the model state/output with real state/output of the system. The aforementioned threshold based method can be regarded as a rough modeling of the system limit without considering the input. However, the battery system is highly nonlinear and a model is not assured to cover every situation. Then, the ambiguity emerges when a fault is indicated which may come from a true battery failure, or can be resulted from an inaccurate model.

A battery pack includes multiple same battery cells connecting in series, meaning that the cells share the same current. In other words, a battery system consists of multiple identical systems with the same inputs, and thus the voltage outputs should be similar, if not at fault conditions. In this way, one cell output can be compared with that of any other cells, or all the other cells can serve as the hardware redundancies of one single cell, even though there is physically no redundancy in the system. It is important to notice that this method is robust because the output comes from the real systems, which is guaranteed to be accurate and does not suffer from convergence issues.

To be precise, the battery cells within a battery pack are not exactly the same. There may be slight variations in the manufacturing process, thermal conditions in usage, balance state, etc. In general, all these variations are reflected into two essential states, i.e., SoC and SoH. These two states affect the static and dynamic behavior of a battery cell by different OCV and internal resistance, respectively. The different OCV leads to an offset in the cell voltages and the difference in internal resistance causes voltage fluctuations with different amplitudes. If the voltage outputs of the battery cells are simply compared, these voltage differences can easily exceed the preset threshold value, making this simple comparison not robust in real applications.

In statistics, a correlation coefficient, or Pearson product-moment correlation coefficient, is a degree of measurement indicating the linear relation between two variables. It is expressed as $$r_{X,Y} = \frac{cov_{X,Y}}{\sigma_X \sigma_Y} = \frac{\sum_{i=1}^{n}(x_i - \mu_x)(y_i - \mu_y)}{\sqrt{\sum_{i=1}^{n}(x_i - \mu_x)^2} \sqrt{\sum_{i=1}^{n}(y_i - \mu_y)^2}} \quad (1)$$

where $r_{X,Y}$ is the correlation coefficient of variables X and Y, $cov_{X,Y}$ is the covariance of X and Y, $\sigma_Z$ is the variance of variable Z, $\mu_Z$ is the mean value variable Z, and n is the number of samples in the data. The correlation coefficient is unitless, and ranges from +1 to −1 inclusive, where +1 indicates total positive correlation, 0 indicates no correlation and −1 indicates total negative correlation.

An important property of the correlation coefficient is given as $$r_{\alpha X + \beta, Y} = r_{X,Y} \quad (2)$$

where α and β are two constants. This property is intuitive because when an offset β is added to any of the variables, it is subtracted from the mean values in Eq. (1), and when the fluctuation amplitude of a variable is multiplied by α, it multiplies both the numerator and denominator by α. Hence, the correlation coefficient measures whether the trend of two curves matches, instead of their exact shape.

This feature is a valuable property in coping with the inconsistencies in lithium-ion batteries when: a) the imbalanced batteries demonstrate different open circuit voltage (OCV), and b) the cells in different aging levels exhibit different internal resistances. If the correlation coefficient of two cell voltages is calculated, the difference in OCV is removed because the static offset does not influence the correlation coefficient, and the difference in internal resistances is eliminated because the correlation coefficient is also independent of the fluctuation amplitudes. Therefore, ideally, the correlation coefficient of two series cell voltages should be close to +1 during normal operations. When a short circuit occurs, the abnormal voltage drop influences the synchronized fluctuation on battery voltages, thus being reflected by the reduced correlation coefficient.

For online implementation, the correlation coefficient can be calculated recursively. Eq. (1) is not a satisfactory formula for such application. Although the mean values can be updated after every sampling recursively, the subtractions from mean values should be calculated individually.

An equivalent expression of the correlation coefficient can be obtained by multiplying both the numerator and denominator of (1) by n, as $$r_{X,Y} = \frac{n\sum_{i=1}^{n} x_i y_i - \left(\sum_{i=1}^{n} x_i\right)\left(\sum_{i=1}^{n} y_i\right)}{\sqrt{n\sum_{i=1}^{n} x_i^2 - \left(\sum_{i=1}^{n} x_i\right)^2} \sqrt{n\sum_{i=1}^{n} y_i^2 - \left(\sum_{i=1}^{n} y_i\right)^2}} \quad (3)$$

Eq. (3) does not require subtractions from the mean values, so it is more appropriate for recursive estimation. The formula of the recursive estimation is then obtained as $$P_k = P_{k-1} + x_i y_i \quad (4)$$

$$Q_k = Q_{k-1} + x_i$$

$$R_k = R_{k-1} + y_i$$

$$S_k = S_{k-1} + x_i^2$$

$$T_k = T_{k-1} + y_i^2$$

$$(r_{X,Y})_k = \frac{kP_k - Q_k R_k}{\sqrt{kS_k - Q_k^2}\sqrt{kT_k - R_k^2}}$$

Eq. (4) can be used to obtain the similarity of the time domain trends for two voltage curves from the beginning of measurement. However, there are still difficulties in implementation: a) if the fault occurs a long time after the beginning of measurement, the abnormal behavior will have negligible effect on the correlation coefficient due to the high similarity of the long history data; b) as time goes by, the magnitudes of updated quantities in Eq. (4) become larger and larger, and will eventually exceed the storage nits of the onboard microprocessors.

The most straightforward approach to solving the above-mentioned problems is to employ a moving window filter for data processing, i.e., at each time instant, the correlation coefficient for the data only in a history time window is calculated. Then Eq. (4) is modified as $$P_k = P_{k-1} + x_i y_i - x_{i-w} y_{i-w} \quad (5)$$

$$Q_k = Q_{k-1} + x_i - x_{i-w}$$

$$R_k = R_{k-1} + y_i - y_{i-w}$$

$$S_k = S_{k-1} + x_i^2 - x_{i-w}^2$$

$$T_k = T_{k-1} + y_i^2 - y_{i-w}^2$$

$$(r_{X,Y})_k = \frac{wP_k - Q_k R_k}{\sqrt{wS_k - Q_k^2}\sqrt{wT_k - R_k^2}}$$

where w is the size of the moving window. It needs to be noted that Eq. (5) should be initialized by Eq. (4) in the first w samples.

It should also be noted that the window size should be chosen with special care. If a large set of data is employed in the calculation, the abnormal voltage variation led by short circuit will have negligible effects in the correlation coefficient. Hence, in order to keep the detection sensitivity to faults, a moving window with a small size is preferred. On the other hand, when the moving window size is too small, the noise will be regarded as abnormal fluctuations and the measurement noises will influence the calculation as well. Therefore, a proper size of moving window should be selected based on the specific application.

When two signals are added to X and Y, respectively, Eq. (1) can be derived as $$r_{X+N,Y+M} = \frac{\text{cov}_{X+N,Y+M}}{\sigma_{X+N}\sigma_{Y+M}} = \quad (6)$$

$$\frac{\sum_{i=1}^{n}(x_i - \mu_x + N_i - \mu_N)(y_i - \mu_y + M_i - \mu_M)}{\sqrt{\sum_{i=1}^{n}(x_i - \mu_x + N_i - \mu_N)^2}\sqrt{\sum_{i=1}^{n}(y_i - \mu_y + M_i - \mu_M)^2}}$$

where N is the signal added to X and M is the signal added to Y. Assume that both N and M are independent of X and Y. Eq. (6) can be simplified as $$r_{X+N,Y+M} = \frac{\sum_{i=1}^{n}(x_i - \mu_x)(y_i - \mu_y) + \sum_{i=1}^{n}(N_i - \mu_N)(M_i - \mu_M)}{\sqrt{\sum_{i=1}^{n}(x_i - \mu_x)^2 + \sum_{i=1}^{n}(N_i - \mu_N)^2}} \quad (7)$$

$$\sqrt{\sum_{i=1}^{n}(y_i - \mu_y)^2 + \sum_{i=1}^{n}(M_i - \mu_M)^2}$$

There are two terms in the numerator of Eq. (7). When the batteries are at rest, the first term is zero because the voltages are very close to their OCVs. When N and M are independent and identically distributed white noises, the second term is zero as well. This indicates that the correlation coefficient is close to zero in this situation. This small value will lead to a sudden drop in the calculation and surely triggers a false positive fault, which may be undesirable.

If Eq. (7) is further expanded to three signals and preferably the mean values of the added signals are all zero, the correlation coefficient can be expressed as $$r_{X+A+N,Y+B+M} = \frac{\sum_{i=1}^{n}(x_i - \mu_x)(y_i - \mu_y) + \sum_{i=1}^{n}A_i B_i + \sum_{i=1}^{n}N_i M_i}{\sqrt{\sum_{i=1}^{n}(x_i - \mu_x)^2 + \sum_{i=1}^{n}A_i^2 + \sum_{i=1}^{n}N_i^2}} \quad (8)$$

$$\sqrt{\sum_{i=1}^{n}(y_i - \mu_y)^2 + \sum_{i=1}^{n}B_i^2 + \sum_{i=1}^{n}M_i^2}$$

where A and B are the newly added signals to X and Y, and assume they are independent of X, Y, N and M. A solution to avoiding the zero correlation coefficient is provided in Eq. (8) when A and B are dependent. In such cases, when the batteries are at rest, Eq. (8) is simplified as $$r_{X+A+N,Y+B+M} = \frac{\text{cov}_{A,B}}{\sqrt{\sigma_A^2 + \sigma_N^2}\sqrt{\sigma_B^2 + \sigma_M^2}} \approx r_{A,B}, \quad (9)$$

$$\sigma_N^2 \ll \sigma_A^2, \sigma_M^2 \ll \sigma_B^2$$

If the variance of noises are negligible to the variance of A and B, the correlation coefficient of X+A+N and Y+B+M will be the same as that of A and B.

Taking advantage of this feature, the same signal can be added to both voltage measurements, which means $r_{A,B}$ is 1, The added signals may be negligible when there are persistent inputs, meanwhile, the variance of the two signals can be larger than that of the noises, such that the correlation coefficient of the two voltages will be close to 1 when the batteries are at rest.

One exemplary design is to add a square wave (or any other periodic wave) with an amplitude of 3 times the standard deviation of the noise standard deviation, namely, 9 times the variance of the noise. As a result, the correlation coefficient is close to 0.9 when the batteries are at rest. Of course, these particular variables are used for exemplary purposed, and other values could be utilized within the scope of the disclosure. The period of the wave should be smaller than the window size. A trivial selection of period can be 2 samples, in one example.

In some applications, tens or hundreds of cells are connected in series. One of ordinary skill in the art may assume only the minority of the cells would have short circuit fault at the same time. Otherwise, the short circuit fault can be easily detected by module or pack level voltage monitoring.

Figure 4:
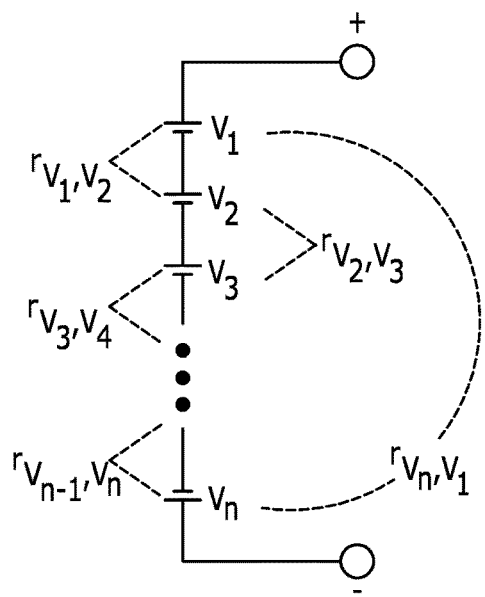
FIG. 4 shows an illustration of correlation coefficients calculated for each neighboring pair of battery cells, according to an exemplary embodiment.

In order to acquire the status of each battery cell, the correlation coefficients for every pair of neighboring cells can be calculated, including that for the first and last cell, as illustrated in FIG. 4, for example. When a fault occurs on one of the cells, the two related correlation coefficients drop and the fault location can be isolated by the overlapped index number. For example, when both $r_{V_1,V_2}$ and $r_{V_2,V_3}$ demonstrate a sudden drop, it indicates a fault on $V_2$ because it is not in the same trend as those of $V_1$ and $V_3$. The same strategy can be applied when multiple faults occurs, as long as the fault cells are the minority of the whole pack, according to this example.

An exemplary sit illation can be used to demonstrate the feasibility of the disclosed detection method. First, an experiment is conducted to apply an urban dynamometer driving schedule (UDDS) to two battery cells connecting in series. The specification of the batteries under test is given in Table 1, and the voltage responses of the two cells, $V_1$ and $V_2$ are given in FIG. 5. The sampling time in the experiment is 0.1 s.

TABLE 1 battery specifications

| Battery cell type | Cylindrical 18650 |
| --- | --- |
| Nominal voltage | 3.2 V |
| Nominal rated capacity | 1.35 Ah |
| Charge voltage | 3.65 V |
| Discharge cut-off voltage | 2.5 V |
| Max pulse discharge | 4.05 A |

Then, a fault signal is constructed by reducing one voltage sample by 100 mV to simulate the sudden voltage drop recovery at the initial phase of internal short circuit. The fault signal is added to $V_1$ and denote the synthesized data as $V_{1,f}$. In order to demonstrate the basic working principle of the detection algorithm, the correlation coefficient of $V_1$ and $V_{1,f}$ are first calculated. It may be noted that, except the fault signal added, the two voltage responses are exactly the same, including the measurement noises. The two voltages are plotted in FIG. 6(a), with the added fault highlighted with an ellipse. The corresponding correlation coefficient of the two voltages are provided in FIG. 6(b) with inset of detection at fault. The moving window sizes are 30, 40 and 50 samples.

Figure 7A:
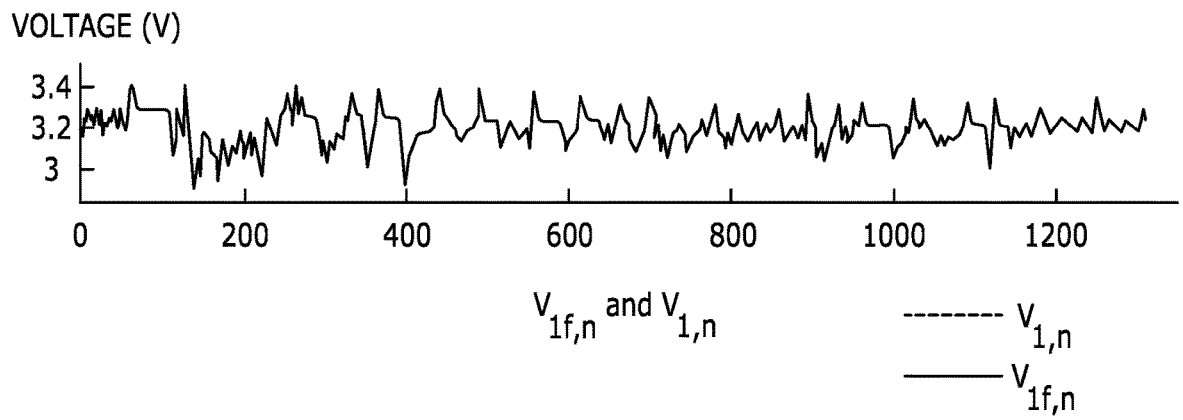
FIG. 7($a$) shows an exemplary simulated graph of voltage responses, according to an exemplary embodiment.
Figure 7B:
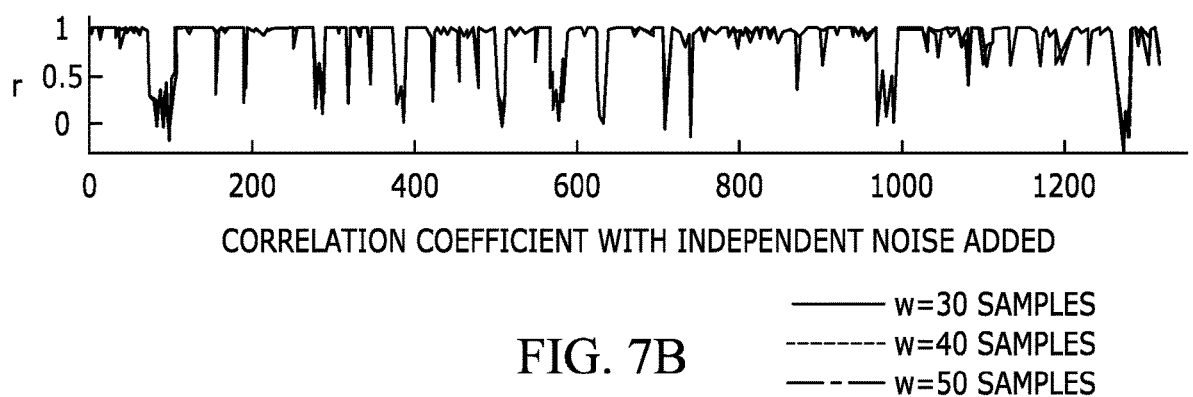

After that, independent white noises with the same standard deviation of 1 mV are added to $V_1$ and $V_{1,f}$, respectively, to emulate the noisy measurements. The noisy voltages, $V_{1,n}$ and $V_{1,f,n}$ are given in FIG. 7(a), and the correlation coefficient of them is calculated in FIG. 7(b).

Figure 7C:
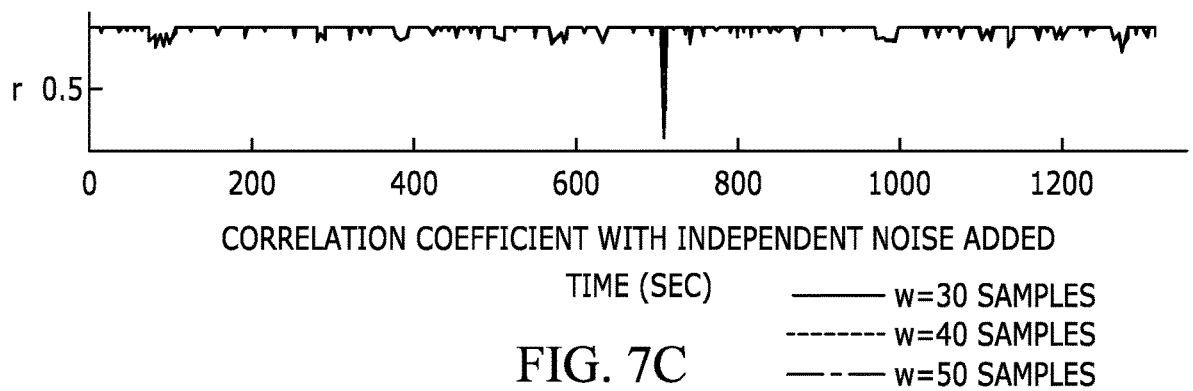

Later, the square wave discussed above can be to $V_{1,n}$ and $V_{1,f,n}$, denoting as $V_{1,n,s}$ and $V_{1,f,n,s}$, and the corresponding correlation coefficient is plotted in FIG. 7(c). The mean value of the square wave is zero, the amplitude is 3 mV and the period is 2 samples.

Figure 8:
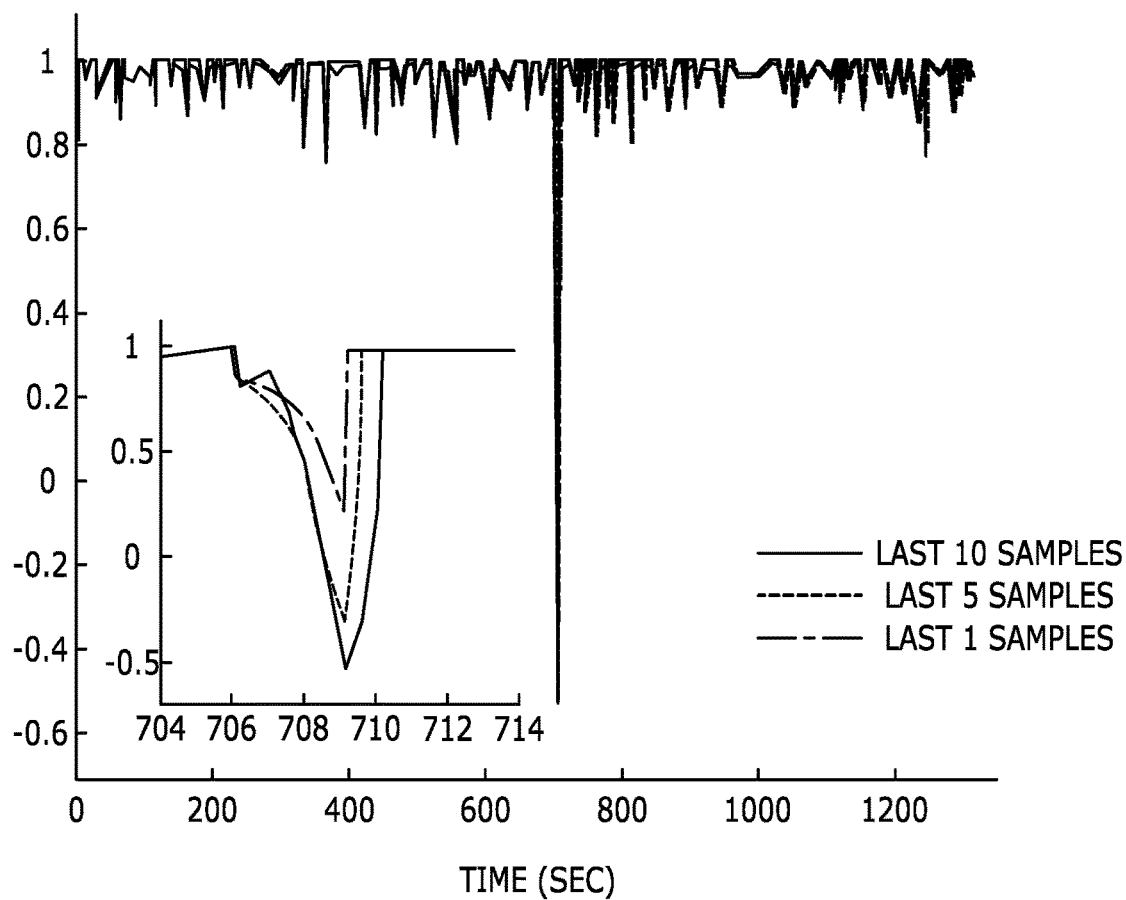
FIG. 8 is an exemplary graph of dropping correlation coefficients as more samples are taken, according to an exemplary embodiment.

Finally, real fault detections are simulated by calculating the correlation coefficient of $V_{1,f,s}$ and $V_{2,s}$. In this simulation, the duration of the voltage drops are varied to be 1, 5 and 10 samples, as shown in FIG. 8, for exemplary purposes.

Figure 5:
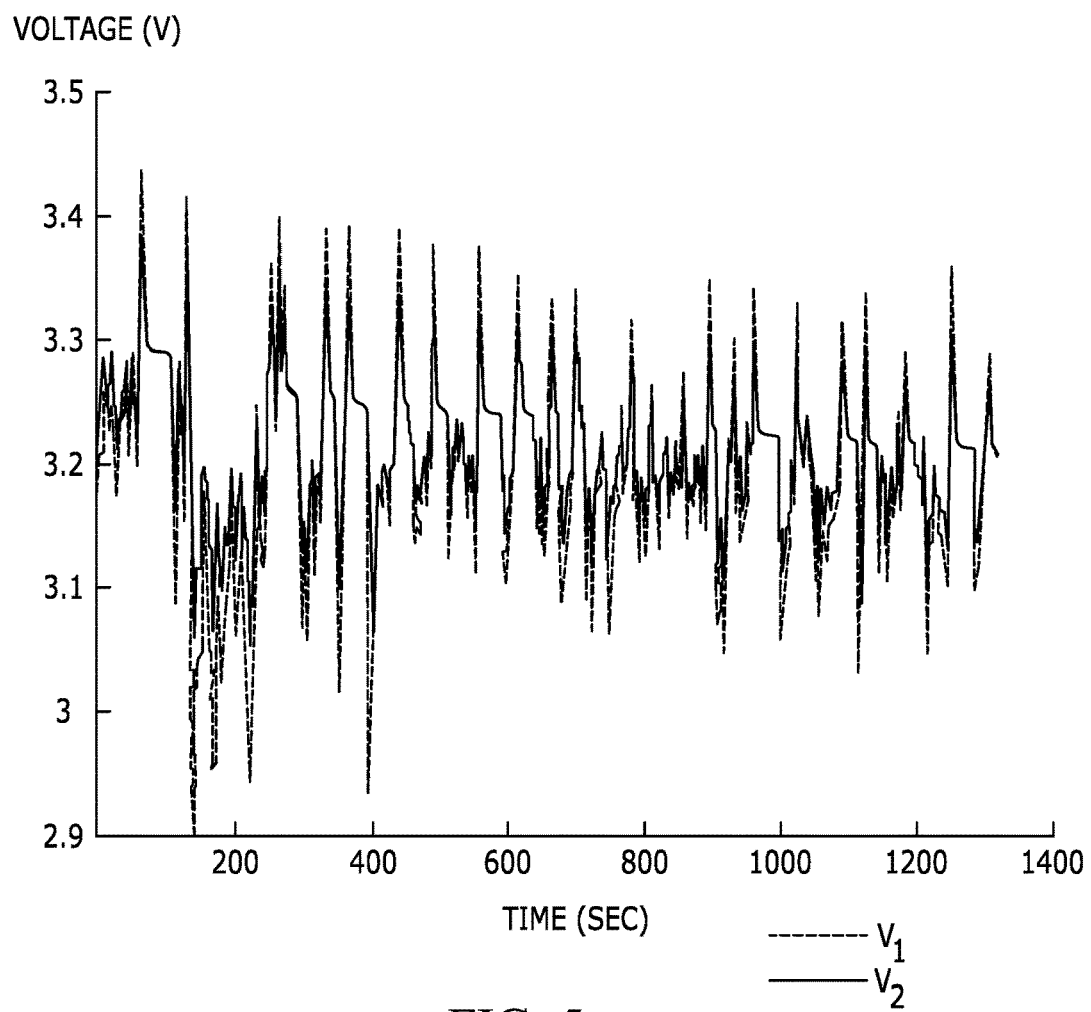
FIG. 5 shows a simulated graph of exemplary voltage responses of two battery cells, according to an exemplary embodiment.
Figure 6A:
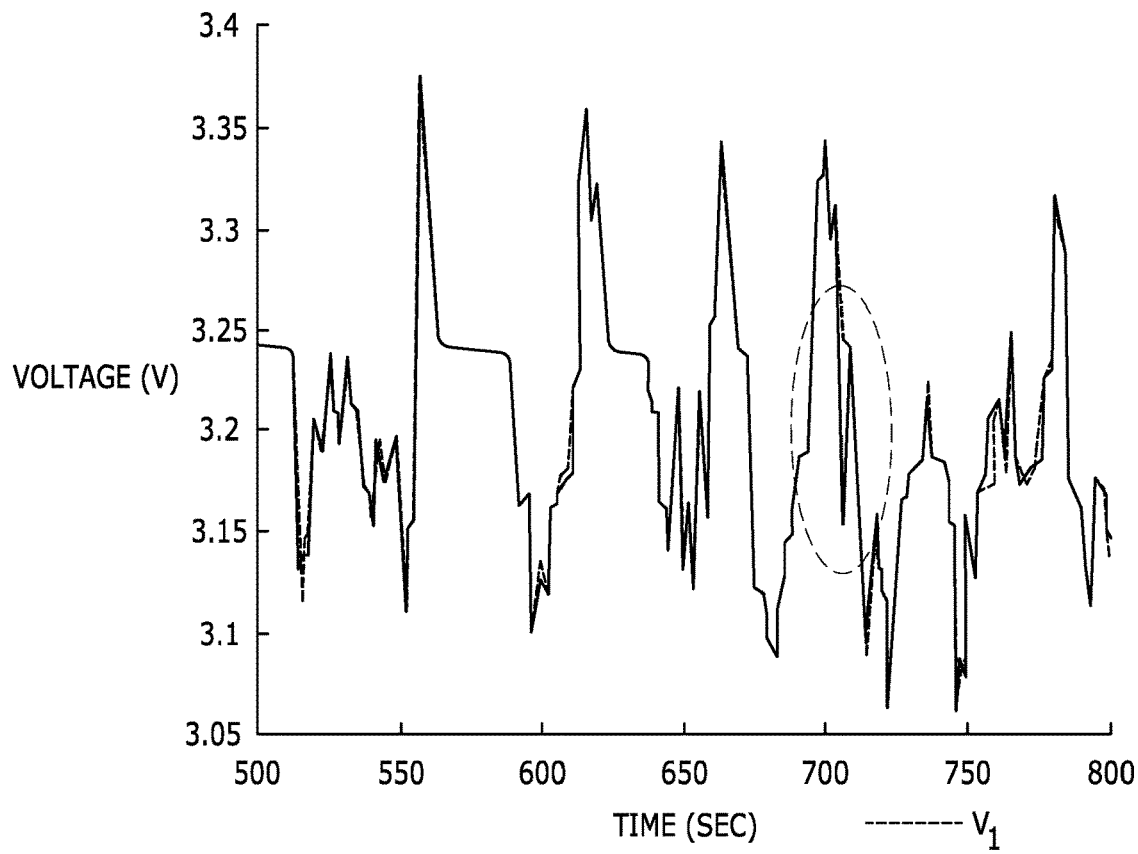
FIG. 6($a$) shows a graph of an exemplary voltage response with a fault signal added, according to an exemplary embodiment.

It can be seen from FIG. 5 that the internal resistances of the two batteries under test are different. Given the same current input, the voltage difference between the two cells can be larger than 100 mV at around 150 s. This large difference will trigger false positive faults if the voltage difference threshold method is applied, or if only one model is tracked online in the model based detection method. FIG. 6(a) shows that the fault signal is added to $V_1$ at around 700 s. The voltage value at fault is not out of the voltage operation range given in Table 1, and thus cannot be detected by the voltage threshold method.

Figure 6B:
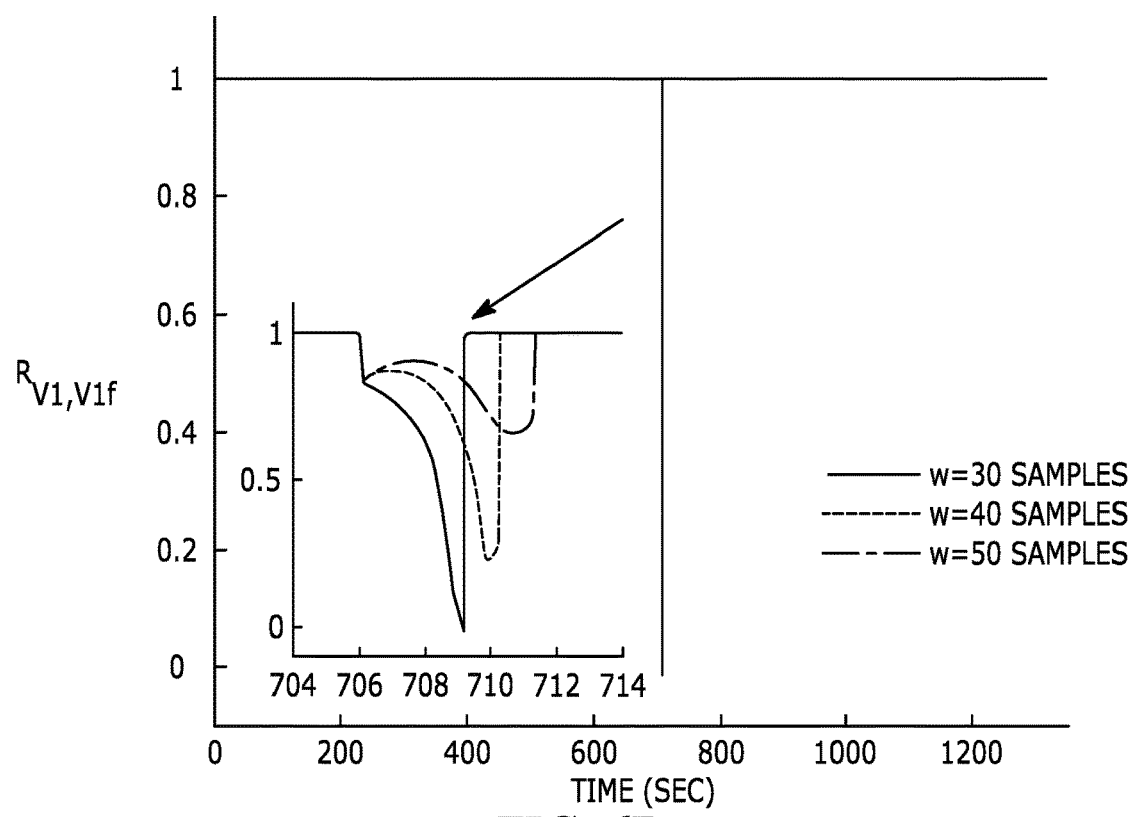

The correlation coefficient calculated in FIG. 6(b) manages to capture the off-trend voltage drop recovery, and the fault is flagged by the drop in the correlation coefficients. The comparisons among the calculation with three different window sizes indicate that a smaller window size leads to higher sensitivity to abnormal voltage variations. Meanwhile, when independent white noises are added to the voltage measurements, the correlation coefficient provided in FIG. 7(b) exhibits more fluctuations than that in FIG. 6(b). It needs to be noted that as the size of the moving window increases, part of the fluctuations is smaller, as the ones at around 160 s, owing to the reduced sensitivity to noises.

However, part of the fluctuations remains the same in spite of the variation in window sizes, as the ones at around 100 s. If a closer look is given to the voltages in FIG. 7(a), it can be found that whenever there is a voltage plateau in measurements, there is an unrecoverable fluctuation in the correlation coefficient. When the batteries are at rest, the correlation coefficient will drop as indicated in Eq. (7), One solution described herein is to add a square wave (or other periodic wave) to the voltage measurements with an amplitude of 3 mV and a period of 2 samples. FIG. 7(c) presents the correlation coefficient with the square wave added, indicating that the induced fault can be easily identified and displayed.

It is understood that the correlation coefficient measures the similarity of the two signals. It can be inferred when the voltage drop led by faults lasts longer, the similarity of the two voltage measurements degrades further, and thus the drop in the correlation coefficient will be larger, as illustrated in FIG. 8. This ensures the robustness of this detection method when multiple samples in the voltage drop are captured, as in the external short circuit cases.

In the simulation, the induced fault is detected with the disclosed correlation based method, whereas the other detection methods lead to various issues. The detection results are summarized in.

TABLE 2

Comparison of simulated short circuit detection results

| Detection method | True fault | False fault |
|---|---|---|
| Voltage threshold based | | |
| Voltage difference threshold based | ✓ | ✓ |
| Model based | ✓ | ✓ |
| Correlation based | ✓ | |

Figure 9:
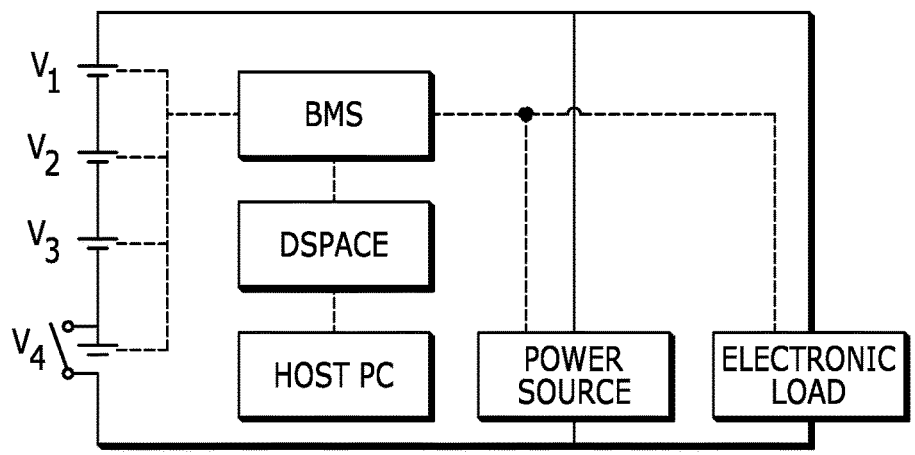
FIG. 9 is an exemplary system including hardware for performing automatic fault detection in a battery pack, according to an exemplary embodiment.

An exemplary system is shown in FIG. 9, as a non-limiting example of hardware operable to perform the functions described herein. Four battery cells (the same as those introduced in Table 1) are connected in series, according to one example. A customizable battery management system (BMS) can be equipped to monitor the voltage, current and temperature of the battery string. All the data are collected with dSPACE Micro-Autobox and saved by memory (not shown) which can be within the host PC, for example. The charge/discharge commands are executed by the direct current power source and electronic load connecting in parallel with the battery string.

Figure 10:
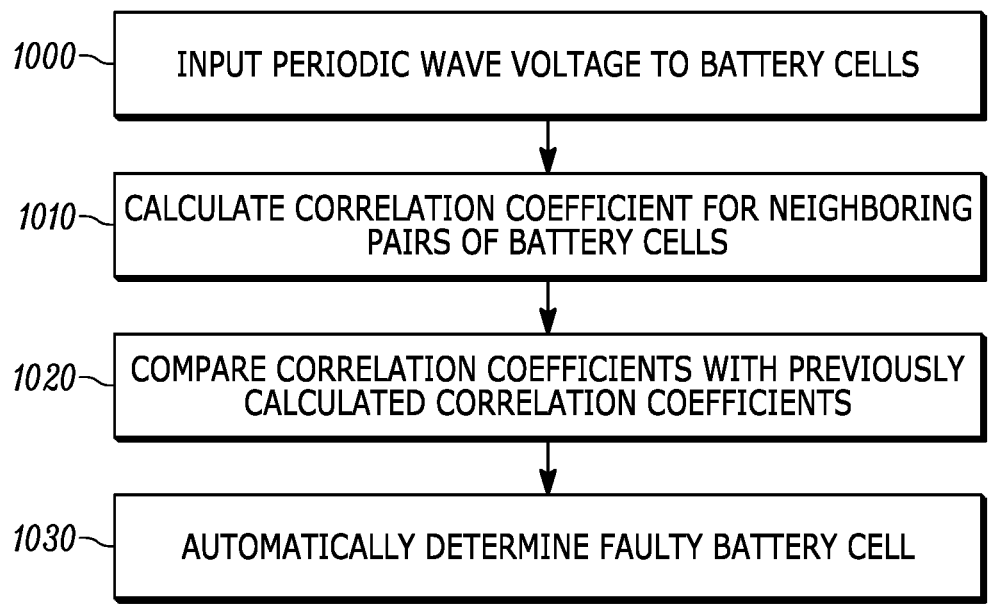
FIG. 10 is an exemplary flowchart illustrating a method of automatic fault detection in battery packs, according to an exemplary embodiment.
Figure 11B:
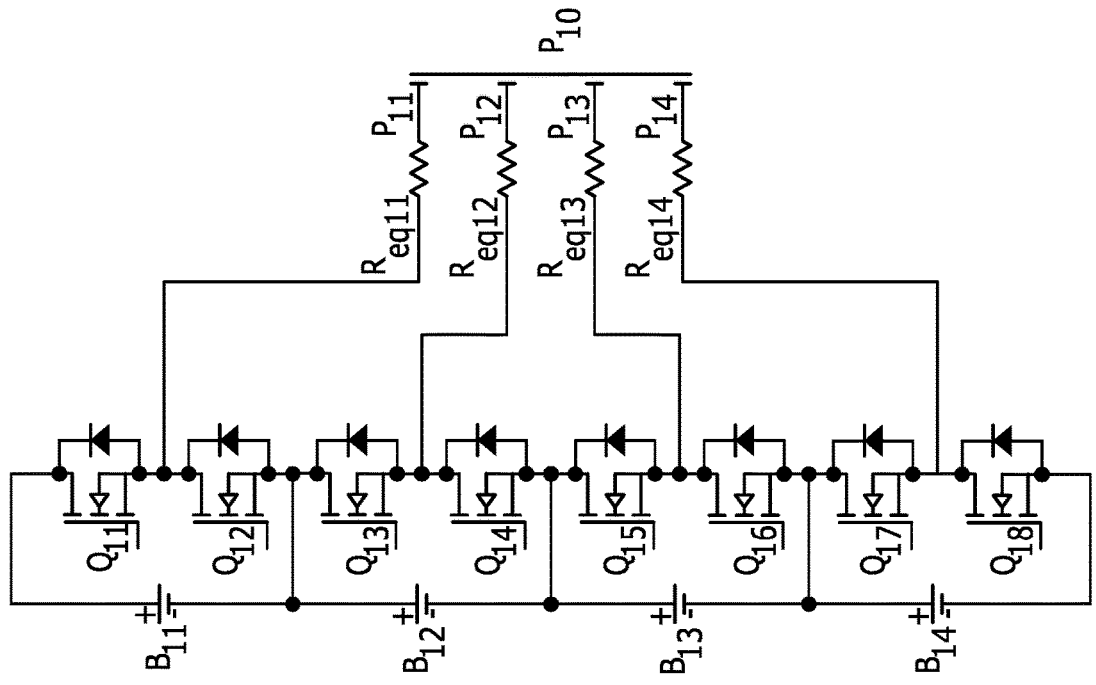
FIGS. 11($a$) and ($b$) show an exemplary schematic and corresponding circuit diagram, respectively, of a switched-coupling-capacitor equalizer for four cells, according to an exemplary embodiment.
Figure 11A:
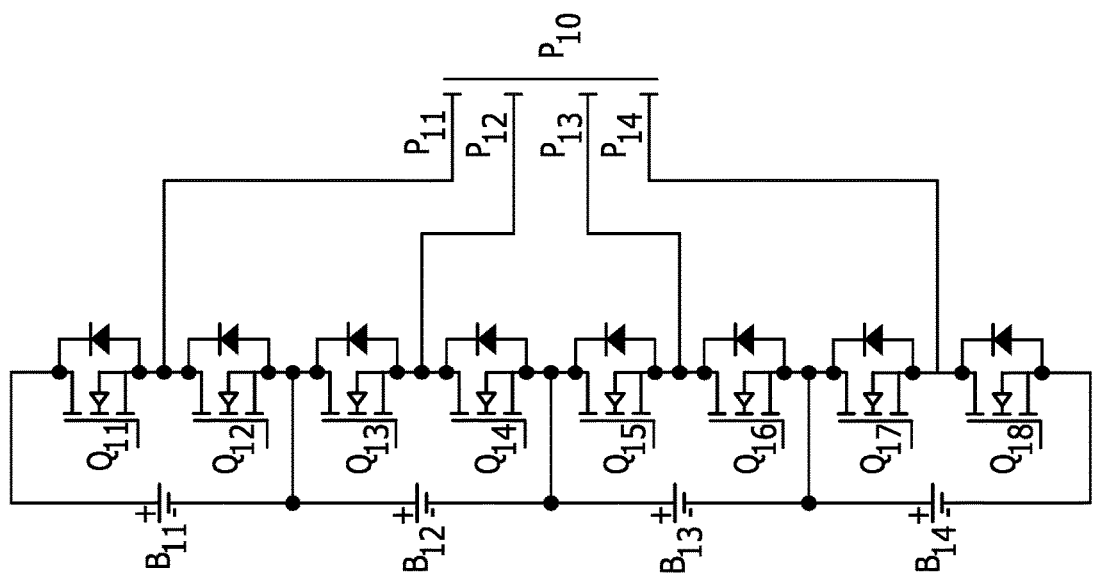

FIG. 10 is a flow diagram illustrating an exemplary method of automatic fault detection in a battery pack, according to an exemplary embodiment. At step 1000, a periodic voltage wave can be input to each of the battery cells in the battery pack. From step 1000, the process moves to step 1010, wherein a correlation coefficient for each neighboring pair of the battery cells, connected in series, can be recursively calculated. The calculations can be performed by one or various processors communicatively coupled to the cells, and the data can be collected recursively via dSPACE, for example, or any other collection/storage mechanism. From step 1010, the process moves to step 1020, where the correlation coefficients are compared with previously calculated coefficients of corresponding cells. It is again noted that any communicatively coupled processor (e.g., Host PC) can perform this comparison. According to certain embodiments, the coefficients can be compared by measuring voltages output at each battery cell sequentially; and shifting the measured voltages in the time domain to align with corresponding previously measured voltages. At step 1030, if there is a drop in the coefficients of neighboring cells, the system can determine automatically which battery cell is faulty. An indication of a fault, as well as which cell is faulty, can be output via a conventional display (not shown) coupled to host PC, for example, or any other display coupled to the system, via hardwiring or wirelessly (e.g., at a remote location), Automatic Battery Cell Equalizing FIG. 11(a) shows an exemplary diagram of a proposed switched-coupling-capacitor equalizer (SCCE) applied to a four-cell battery string, according to an embodiment herein. Each battery cell is connected in parallel with two series-connected MOSFETs. Five capacitor plates (four small plates and one big plate (i.e., larger than each of the smaller plates)) are used to form a coupling capacitor to transfer energy among cells. Each small plate ($P_{11}$-$P_{14}$) is connected to the midpoint of the corresponding two series-connected MOSFETs. The big plate ($P_{10}$) is large enough to be common to the four small plates, thus materializing the star connection. In fact, the coupling capacitor can also be implemented by four capacitors connected via a star connection. The equivalent circuit of the proposed SCCE is shown in FIG. 11(b).

According to various embodiments described herein, an SCCE within the scope of the present embodiments may have the following characteristics: Two MOSFET switches and one capacitor are needed for each cell, thereby leading to a small size and low cost; Only one pair of complementary PWM signals are employed to control all. MOSFET switches, by Which automatic voltage equalization without the need of cell monitoring is achieved, showing a simple control; Energy can be transferred automatically and directly from higher voltage cells at any position to lower voltage cells at any position, leading to a higher balancing efficiency and speed; Accurate voltage equalization is achieved without any requirements for the matching of the coupling capacitor and MOSFETs; Contrary to the conventional modularized equalizers using additional components for the equalization among modules, the proposed method can achieve the equalization among modules by connecting the common nodes of the coupling capacitors, leading to smaller size, lower cost, and reduced loss related to the modularization; The balancing operation can be carried out regardless of the battery working state of charging, discharging or rest; and The proposed SCCE can also be applied to other rechargeable batteries without any change or recalibration, such as nickel-cadmium batteries, lead-acid batteries, and nickel-metal-hydride batteries.

Figure 13:
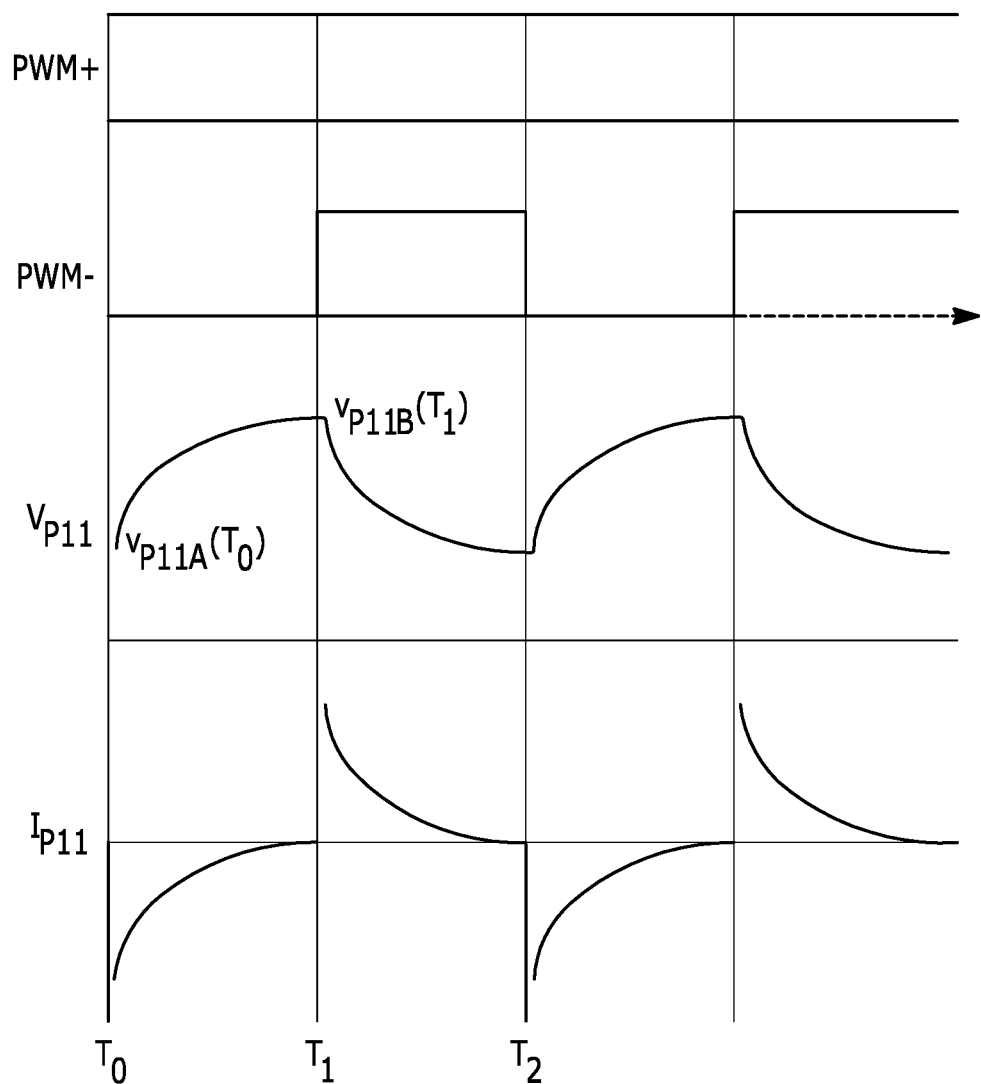
FIG. 13 shows exemplary pulse width modulation, voltage and current waveforms of an exemplary switched-coupling-capacitor equalizer, according to an exemplary embodiment.

The automatic any-cells-to-any-cells equalization among cells can be obtained by driving the MOSFET switches using one pair of complementary PWM signals, i.e., PWM+ and PWM−. The proposed equalizer has two steady working states in one switching period. FIGS. 12 and 13 show the operating states and theoretical waveforms of a proposed equalizer, respectively, according to an exemplary embodiment. In order to simplify the analysis for the operation principles, it can be assumed for example that the battery cell voltages follow $V_{B11} > V_{B12} > V_{B13} > V_{B14}$.

State I ($t_0$-$t_1$): At $t_0$, MOSFETs $Q_{11}$, $Q_{13}$, $Q_{15}$, $Q_{17}$ are Turned on, and MOSFETs $Q_{12}$, $Q_{14}$, $Q_{16}$, $Q_{18}$ are Turned Off.

As shown FIG. 12(a), the coupling capacitor is connected in parallel with the corresponding upper cells ($B_{11}$-$B_{13}$) through $Q_{11}$, $Q_{13}$, $Q_{15}$, and $Q_{17}$. As shown in FIGS. 12(a.1)-(a.3), six discharging paths from the battery cells are constructed.

As shown in FIG. 12(a.1), $i_{1A}$ flows from $B_{11}$ to $P_{11}$-$P_{10}$-$P_{12}$ through $Q_{11}$ and $Q_{13}$. $i_{2A}$ flows from $B_{12}$ to $P_{12}$-$P_{10}$-$P_{13}$ through $Q_{13}$ and $Q_{15}$. $i_{3A}$ flows from $B_{13}$ to $P_{13}$-$P_{10}$-$P_{14}$ through $Q_{15}$ and $Q_{17}$. As shown in FIG. 12(a.2), $i_{4A}$ flows from $B_{11}$ and $B_{12}$ to $P_{11}$-$P_{10}$-$P_{13}$ through $Q_{11}$ and $Q_{15}$. $i_{5A}$ flows from $B_{12}$ and $B_{13}$ to $P_{12}$-$P_{10}$-$P_{14}$ through $Q_{13}$ and $Q_{17}$. As shown in FIG. 12(a.3), $i_{6A}$ flows from $B_{11}$, $B_{12}$, and $B_{13}$ to $P_{11}$-$P_{10}$-$P_{14}$ through $Q_{11}$ and $Q_{17}$. During this state, energy in the upper cells $B_{11}$-$B_{13}$ is transferred to the coupling capacitor.

If the coupling capacitor and MOSFETs have identical characteristic, it is possible to assume the following:

$$C_{eq} = C_{11} = C_{12} = C_{13} = C_{14} \quad (10)$$

$$R_{eq} = R_{eq11} = R_{eq12} = R_{eq13} = R_{eq14} \quad (11)$$

where $C_{1j}$, j=1, 2, 3, 4, represents the equivalent capacitance between the plates $P_{1j}$ and $P_{10}$. $R_{eq1j}$, j=1, 2, 3, 4, represents the equivalent resistance in each branch.

During State I, the balancing current across the capacitor plates can be expressed as $$\begin{cases} i_{P11A} = i_{1A} + i_{4A} + i_{6A}, \\ i_{P12A} = i_{2A} - i_{1A} + i_{5A}, \\ i_{P13A} = i_{3A} - i_{2A} - i_{4A}, \\ i_{P14A} = -i_{3A} - i_{5A} - i_{6A}, \end{cases} \quad (12)$$

where $i_{P1jA}$, j=2, 3, 4, represents the balancing current across the plate $P_{1j}$ during State I.

By using Kirchhoff's voltage law (KVL), the relationship between the cell voltages and the coupling capacitor voltages can be expressed as follows:

$$\begin{cases} \frac{V_{B11} - v_{P11A}(t_0) + v_{P12A}(t_0)}{s} = \left(R_{eq} + \frac{1}{s \cdot C_{eq}}\right)(-i_{P11A} + i_{P12A}), \\ \frac{V_{B12} - v_{P12A}(t_0) + v_{P13A}(t_0)}{s} = \left(R_{eq} + \frac{1}{s \cdot C_{eq}}\right)(-i_{P12A} + i_{P13A}), \\ \frac{V_{B13} - v_{P13A}(t_0) + v_{P14A}(t_0)}{s} = \left(R_{eq} + \frac{1}{s \cdot C_{eq}}\right)(-i_{P13A} + i_{P14A}), \end{cases} \quad (13)$$

where $v_{P1jA}(t_0)$, j=1, 2, 3, 4, represents the voltage between $P_{1j}$ and $P_{10}$ at $t_0$. $V_{B1j}$, j=1, 2, 3, 4, is the cell voltage of $B_{1j}$.

By using Kirchhoff's current law (KCL), the relationship among the balancing currents across the coupling capacitor can be expressed as $$i_{P11A} + i_{P12A} + i_{P13A} + i_{P14A} = 0. \quad (14)$$

By solving Eq. (13) and Eq. (14), the balancing currents across the coupling capacitor in the frequency domain can be expressed as $$\begin{bmatrix} i_{P11A}(s) \\ i_{P12A}(s) \\ i_{P13A}(s) \\ i_{P14A}(s) \end{bmatrix} = \frac{1}{R_{eq}} \cdot \frac{1}{s + \frac{1}{R_{eq} \cdot C_{eq}}} \cdot A \cdot B, \quad (15a)$$

where $$A = \begin{bmatrix} -\frac{3}{4} & -\frac{1}{2} & -\frac{1}{4} & \frac{1}{4} \\ \frac{1}{4} & -\frac{1}{2} & -\frac{1}{4} & \frac{1}{4} \\ \frac{1}{4} & \frac{1}{2} & -\frac{1}{4} & \frac{1}{4} \\ \frac{1}{4} & \frac{1}{2} & \frac{3}{4} & \frac{1}{4} \end{bmatrix}, B = \begin{bmatrix} V_{B11} - v_{P11A}(t_0) + v_{P12A}(t_0) \\ V_{B12} - v_{P12A}(t_0) + v_{P13A}(t_0) \\ V_{B13} - v_{P13A}(t_0) + v_{P14A}(t_0) \\ 0 \end{bmatrix}. \quad (15b)$$

By Eq. (15a) and Eq. (15b), the balancing currents can be turned into these in the time domain, given by $$\begin{bmatrix} i_{P11A}(t) \\ i_{P12A}(t) \\ i_{P13A}(t) \\ i_{P14A}(t) \end{bmatrix} = \frac{1}{R_{eq}} \cdot e^{-\frac{1}{R_{eq} \cdot C_{eq}}(t-t_0)} \cdot A \cdot B. \quad (16)$$

where $t_0 < t < t_1$. Based on Eq. (16), FIG. 13 presents the theoretical waveform of the balancing current. Using Eq. (15a) and Eq. (15b), the voltages across the coupling capacitor in the frequency domain can be derived as $$\begin{bmatrix} v_{P11A}(s) \\ v_{P12A}(s) \\ v_{P13A}(s) \\ v_{P14A}(s) \end{bmatrix} = \frac{1}{s \cdot C_{eq}} \begin{bmatrix} i_{P11A}(s) \\ i_{P12A}(s) \\ i_{P13A}(s) \\ i_{P14A}(s) \end{bmatrix} = \left(\frac{1}{s} - \frac{1}{s + \frac{1}{R_{eq} \cdot C_{eq}}}\right) \cdot A \cdot B. \quad (17)$$

Eq. (17) can be turned into these in the time domain, shown as $$\begin{bmatrix} v_{P11A}(t) \\ v_{P12A}(t) \\ v_{P13A}(t) \\ v_{P14A}(t) \end{bmatrix} = \left(1 - e^{-\frac{1}{R_{eq} \cdot C_{eq}}(t-t_0)}\right) \cdot A \cdot B + \begin{bmatrix} v_{P11A}(t_0) \\ v_{P12A}(t_0) \\ v_{P13A}(t_0) \\ v_{P14A}(t_0) \end{bmatrix}. \quad (18)$$

where $t_0 < t < t_1$. Based on Eq. (18), FIG. 13 presents the theoretical waveform of the coupling capacitor voltage.

At $t_1$, the balancing current drops to 0. Based on. KVL, the relationship among the cell voltages and the coupling capacitor voltages can be expressed as $$\begin{cases} v_{P11A}(t_1) - v_{P12A}(t_1) = V_{B11}, \\ v_{P12A}(t_1) - v_{P13A}(t_1) = V_{B12}, \\ v_{P13A}(t_1) - v_{P14A}(t_1) = V_{B13}, \\ v_{P11A}(t_1) - v_{P13A}(t_1) = V_{B11} + V_{B12}, \\ v_{P12A}(t_1) - v_{P14A}(t_1) = V_{B12} + V_{B13}, \\ v_{P11A}(t_1) - v_{P14A}(t_1) = V_{B11} + V_{B12} + V_{B13}. \end{cases} \quad (19)$$

Eq. (19) can be simplified as $$\begin{cases} v_{P11A}(t_1) - v_{P12A}(t_1) = V_{B11}, \\ v_{P12A}(t_1) - v_{P13A}(t_1) = V_{B12}, \\ v_{P13A}(t_1) - v_{P14A}(t_1) = V_{B13}. \end{cases} \quad (20)$$

State II ($t_1$-$t_2$): At $t_1$, MOSFETs $Q_{12}$, $Q_{14}$, $Q_{16}$, $Q_{18}$ are Turned on, and MOSFETs $Q_{11}$, $Q_{13}$, $Q_{15}$, $Q_{17}$ are Turned Off.

As shown in FIG. 12(b), the coupling capacitor can be connected in parallel with the corresponding lower cells ($B_{12}$-$B_{14}$) through $Q_{12}$, $Q_{14}$, $Q_{16}$, and $Q_{18}$. As shown in FIG. 12(b.1)-(b.3), six charging paths to battery cells are constructed.

Figure 14A:
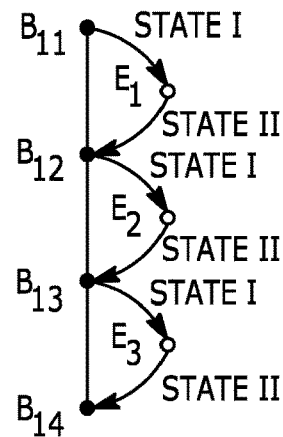
FIGS. 14($a$)-($c$) show exemplary graphs of balancing between adjacent cells, between every other cell, and between the first and last cell, respectively, according to an exemplary embodiment.

As shown in FIG. 12(b.1), $i_{1B}$ flows from $P_{11}$-$P_{10}$-$P_{12}$ to $B_{12}$ through $Q_{12}$ and $Q_{14}$, which achieves the energy transfer from $B_{11}$ to $B_{12}$, $i_{2B}$ flows from $P_{13}$-$P_{10}$-$P_{13}$ to $B_{13}$ through $Q_{14}$ and $Q_{16}$, which achieves the energy transfer from $B_{12}$ to $B_{13}$. $i_{3B}$ flows from $P_{13}$-$P_{10}$-$P_{14}$ to $B_{14}$ through $Q_{16}$ and $Q_{18}$, which achieves the energy transfer from $B_{13}$ to $B_{14}$. FIG. 14(a) gives the directed graph of the energy transfer shown in FIGS. 12(a.1) and (b.1), demonstrating that the proposed SCCE can achieve the conventional adjacent-cell-to-adjacent-cell equalization.

Figure 14B:
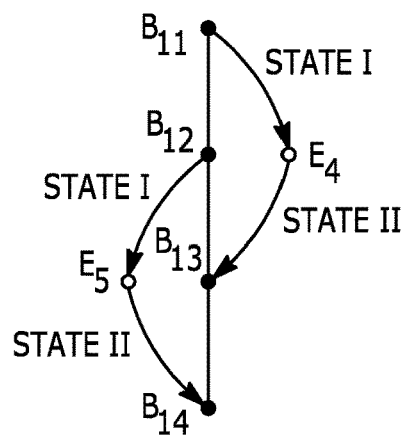

As shown in FIG. 12(b.2), $i_{4B}$ flows from $P_{11}$-$P_{10}$-$P_{13}$ to $B_{12}$ and $B_{13}$ through $Q_{12}$ and $Q_{16}$, which achieves the energy transfer from $B_{11}$ to $B_{13}$. $i_{5B}$ flows from $P_{12}$-$P_{10}$-$P_{14}$ to $B_{13}$ and $B_{14}$ through $Q_{14}$ and $Q_{18}$, which achieves the energy transfer from $B_{12}$ to $B_{14}$. FIG. 14(b) gives the directed graph of the energy transfer shown in FIGS. 12(a.2) and (b.2), demonstrating that the proposed SCCE achieves the equalization between all cells.

Figure 14C:
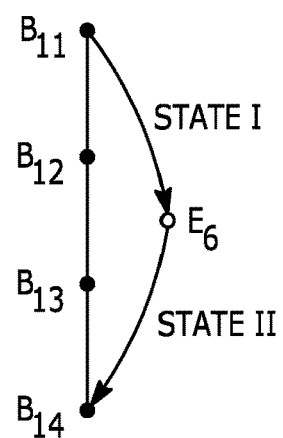

As shown in FIG. 12(b.3), $i_{6B}$ flows from $P_{11}$-$P_{10}$-$P_{14}$ to $B_{12}$, $B_{13}$, and $B_{14}$ through $Q_{12}$ and $Q_{18}$, which achieves the energy transfer from $B_{11}$ to $B_{34}$. FIG. 14(c) gives the directed graph of the energy transfer shown in FIGS. 12(a.3) and (b.3), proving that the proposed SCCE achieves the direct equalization between the first cell and last one in a battery string.

It can be seen that the proposed equalizer can transfer energy directly between any two cells in a battery string.

During State II, the balancing current across the capacitor plates can be expressed as $$\begin{cases} i_{P11B} = i_{1B} + i_{4B} + i_{6B}, \\ i_{P12B} = i_{2B} - i_{1B} + i_{5B}, \\ i_{P13B} = i_{3B} - i_{2B} - i_{4B}, \\ i_{P14B} = -i_{3B} - i_{5B} - i_{6B}, \end{cases} \quad (21)$$

where $i_{P1jB}$, j=1, 2, 3, 4, represents the balancing current across $P_{1j}$ during State II.

By using KVL, the relationship among the cell voltages and the coupling capacitor voltages can be expressed $$\begin{cases} \dfrac{v_{P11B}(t_1) - V_{B12} - v_{P12B}(t_1)}{s} = \left(R_{eq} + \dfrac{1}{s \cdot C_{eq}}\right)(i_{P11B} - i_{P12B}), \\ \dfrac{v_{P12B}(t_1) - V_{B13} - v_{P13B}(t_1)}{s} = \left(R_{eq} + \dfrac{1}{s \cdot C_{eq}}\right)(i_{P12B} - i_{P13B}), \\ \dfrac{v_{P13B}(t_1) - V_{B14} - v_{P14B}(t_1)}{s} = \left(R_{eq} + \dfrac{1}{s \cdot C_{eq}}\right)(i_{P13B} - i_{P14B}), \end{cases} \quad (22)$$

where $v_{P1jB}(t_1)$, j=1, 2, 3, 4, represents the voltage between $P_{1j}$ and $P_{10}$ at $t_1$.

By using KCL, the relationship among the balancing currents across the coupling capacitor can be expressed as $$i_{P11B} + i_{P12B} + i_{P13B} + i_{P14B} = 0. \quad (23)$$

By solving Eqs. (22) and (23), the balancing currents in the frequency domain can be obtained as $$\begin{bmatrix} i_{P11B}(s) \\ i_{P12B}(s) \\ i_{P13B}(s) \\ i_{P14B}(s) \end{bmatrix} = \dfrac{1}{R_{eq}} \cdot \dfrac{1}{s + \dfrac{1}{R_{eq} \cdot C_{eq}}} \cdot C \cdot D, \quad (24a)$$

where $$C = \begin{bmatrix} \frac{3}{4} & \frac{1}{2} & \frac{1}{4} & \frac{1}{4} \\ -\frac{1}{4} & \frac{1}{2} & \frac{1}{4} & \frac{1}{4} \\ -\frac{1}{4} & -\frac{1}{2} & \frac{1}{4} & \frac{1}{4} \\ -\frac{1}{4} & -\frac{1}{2} & -\frac{3}{4} & \frac{1}{4} \end{bmatrix}, \quad D = \begin{bmatrix} v_{P11B}(t_1) - V_{B12} - v_{P12B}(t_1) \\ v_{P12B}(t_1) - V_{B13} - v_{P13B}(t_1) \\ v_{P13B}(t_1) - V_{B14} - v_{P14B}(t_1) \\ 0 \end{bmatrix}. \quad (24b)$$

By Eq. (24a) and Eq. (24b), the balancing currents can be transferred into these in the time domain, given by $$\begin{bmatrix} i_{P11B}(t) \\ i_{P12B}(t) \\ i_{P13B}(t) \\ i_{P14B}(t) \end{bmatrix} = \dfrac{1}{R_{eq}} \cdot e^{-\frac{1}{R_{eq} \cdot C_{eq}}(t - t_1)} \cdot C \cdot D. \quad (25)$$

where $t_1 < t < t_2$. Using Eq. (24a) and Eq. (24b), the voltages across the coupling capacitor in the frequency domain can be achieved as $$\begin{bmatrix} v_{P11B}(s) \\ v_{P12B}(s) \\ v_{P13B}(s) \\ v_{P14B}(s) \end{bmatrix} = \left(\dfrac{1}{s} - \dfrac{1}{s + \dfrac{1}{R_{eq} \cdot C_{eq}}}\right) \cdot C \cdot D. \quad (26)$$

Eq. (26) can be turned into these in the time domain, shown as $$\begin{bmatrix} v_{P11B}(t) \\ v_{P12B}(t) \\ v_{P13B}(t) \\ v_{P14B}(t) \end{bmatrix} = \left(1 - e^{-\frac{1}{R_{eq} \cdot C_{eq}}(t - t_1)}\right) \cdot C \cdot D + \begin{bmatrix} v_{P11B}(t_1) \\ v_{P12B}(t_1) \\ v_{P13B}(t_1) \\ v_{P14B}(t_1) \end{bmatrix}. \quad (27)$$

where $t_1 < t < t_2$.

At $t_2$, the balancing current drops to 0. Based on KVL, the relationship among the cell voltages and the coupling capacitor voltages can be expressed as $$\begin{cases} v_{P11B}(t_2) - v_{P12B}(t_2) = V_{B12}, \\ v_{P12B}(t_2) - v_{P13B}(t_2) = V_{B13}, \\ v_{P13B}(t_2) - v_{P14B}(t_2) = V_{B14}, \\ v_{P11B}(t_2) - v_{P13B}(t_2) = V_{B12} + V_{B13}, \\ v_{P12B}(t_2) - v_{P14B}(t_2) = V_{B13} + V_{B14}, \\ v_{P11B}(t_2) - v_{P14B}(t_2) = V_{B12} + V_{B13} + V_{B14}. \end{cases} \quad (28)$$

Eq. (28) can be simplified as $$\begin{cases} v_{P11B}(t_2) - v_{P12B}(t_2) = V_{B12}, \\ v_{P12B}(t_2) - v_{P13B}(t_2) = V_{B13}, \\ v_{P13B}(t_2) - v_{P14B}(t_2) = V_{B14}. \end{cases} \quad (29)$$

Figure 15:
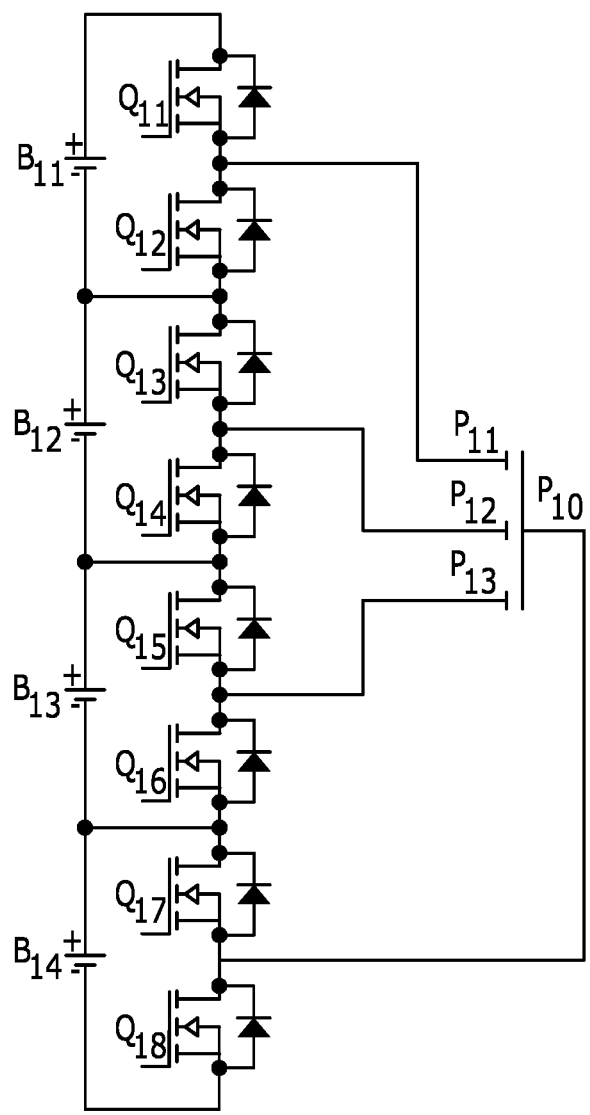
FIG. 15 shows an exemplary simplified switched-coupling-capacitor equalizer for four cells, according to an exemplary embodiment.

It is noted that the solutions for Eq. (20) and Eq. (29) may not be unique, indicating the uncertainty of the coupling capacitor voltages, which is because the potential of $P_{10}$ is floating. In fact, Eq. (20) and Eq. (29) imply that one capacitor can be removed from the switched coupling capacitor, and the simplified equalizer is shown in FIG. 15. This equalization circuit can achieve the same balancing performance as that shown in FIG. 11 with the same operation principles, thereby being not described in detail here.

Table 3 summarizes the balancing paths between any two cells under the assumption of $V_{B11} > V_{B12} > V_{B13} > V_{B14}$. It can be seen that due to the coupling capacitor, energy can be automatically and directly transferred from higher voltage cells at any position to lower voltage cells at any position, leading to a high balancing efficiency and speed.

TABLE 3

Balancing Paths Between any Two Cells

| Path across the SCC | $B_{11}$ | $B_{12}$ | $B_{13}$ | $B_{14}$ |
|---|---|---|---|---|
| $B_{11}$ | — | $P_{11}$-$P_{10}$-$P_{12}$ | $P_{11}$-$P_{10}$-$P_{13}$ | $P_{11}$-$P_{10}$-$P_{14}$ |
| $B_{12}$ | $P_{11}$-$P_{10}$-$P_{12}$ | — | $P_{12}$-$P_{10}$-$P_{13}$ | $P_{12}$-$P_{10}$-$P_{14}$ |
| $B_{13}$ | $P_{11}$-$P_{10}$-$P_{13}$ | $P_{12}$-$P_{10}$-$P_{13}$ | — | $P_{13}$-$P_{10}$-$P_{14}$ |
| $B_{14}$ | $P_{11}$-$P_{10}$-$P_{14}$ | $P_{12}$-$P_{10}$-$P_{14}$ | $P_{13}$-$P_{10}$-$P_{14}$ | — |

The balancing power of each cell can be calculated as $$P_{B1j}=V_{B1j}I_{B1j}, \quad (30)$$

where j=1, 2, 3, 4. $V_{B1j}$ is the cell voltage of the batter cell $B_{1j}$. $I_{B1j}$ is the average balancing current of $B_{1j}$.

The balancing efficiency is obtained as $$\eta_e = \frac{\sum_{j=1}^{4} IF(P_{B1j} > 0)}{\left|\sum_{j=1}^{4} IF(P_{B1j} < 0)\right|} \times 100\%, \quad (31)$$

where $$\begin{cases} IF(P_{B1j} < 0) = \begin{cases} P_{B1j}, & \text{when } P_{B1j} < 0 \\ 0, & \text{when } P_{B1j} \geq 0 \end{cases} \\ IF(P_{B1j} > 0) = \begin{cases} P_{B1j}, & \text{when } P_{B1j} > 0 \\ 0, & \text{when } P_{B1j} \leq 0 \end{cases} \end{cases} \quad (32)$$

It is specified that the current flowing out of a battery cell is negative, and otherwise positive. It can be seen that the balancing efficiency is determined by the cell charge power and the cell discharge power.

Figure 16:
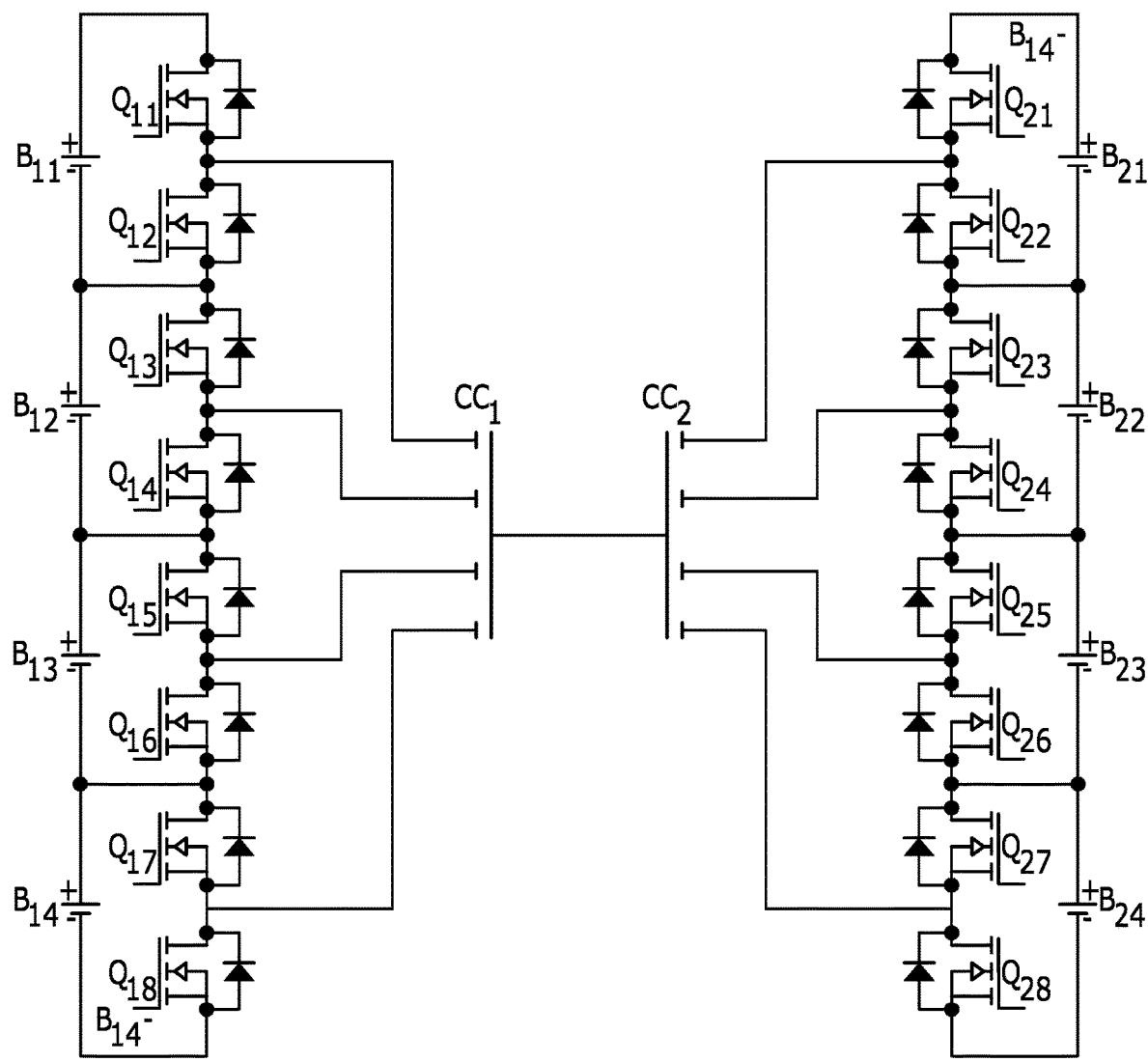
FIG. 16 shows an exemplary modularized structure of a disclosed switched-coupling-capacitor equalizer, according to an exemplary embodiment.

As shown in FIG. 16, a modularization concept of the proposed SCCE is applied to an eight-cell series-connected battery string, which is divided into two separate four-cell modules. It can be seen that the global equalization among cells is achieved through the connection of the common nodes of the two coupling capacitors $CC_1$ and $CC_2$. Contrary to the conventional modularized equalizers using additional components for the equalization among modules, the proposed modularization methods share a single equalizer for the equalization among cells and modules, leading to smaller size, lower cost, and reduced loss with respect to the modularization.

Figure 17:
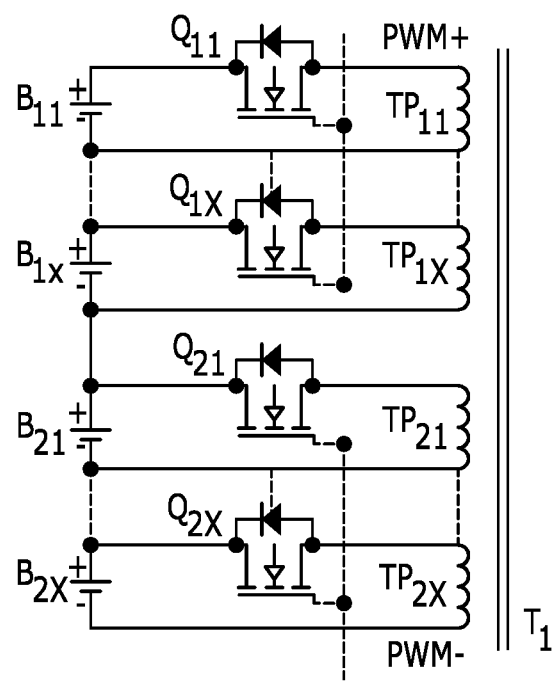
FIG. 17 shows an exemplary equalizer based of forward-flyback conversion, according to an exemplary embodiment.

FIG. 17 shows exemplary schematic diagram of one equalizer applied to a long battery sting, according to an exemplary embodiment. The exemplary equalizer is divided into two groups, Group I and Group II, for exemplary purposed, and x cells in each group. Of course, the depicted length of the equalizer is depicted for exemplary purposes and one of skill in the art would realize that various other lengths and groups could be included within the scope of the disclosure.

Each battery cell is connected by one MOSFET and one primary winding of the multi-winding transformer. As shoes in FIG. 17, the windings in each group have the same polarities, which can be implemented by the conventional forward converter. However, they exhibit opposite polarities compared with the windings in the neighboring group, which can be implemented by the conventional flyback converter, for example. The MOSFETs in the two groups are respectively controlled by one pair of complementary signals, i.e., the MOSFETs in Group I controlled by PWM+, and those in Group II controlled by PWM-. Here, any periodic signal may be utilized.

Some characteristics of the described equalizer can include: the equalizer is a hybrid type of forward and flyback converters, which takes full use of the magnetic core and improves the power density; the new combined forward-flyback equalizer needs only one winding and one MOSFET for one cell; compared with the conventional equalizers using multi-winding transformers, the MOSFET number of the disclosed equalizer can be reduced by at least half; moreover, the corresponding floating drive circuits are also reduced greatly. Therefore, the proposed equalizer is smaller and cheaper, and has lower weight than conventional equalizers; the control for the proposed equalizer requires only one pair of complementary PWM signals with a fixed frequency and duty ratio employed to control all MOSFET switches, by which automatic voltage equalization is achieved without the need of cell monitoring circuits. The balancing operation among cells in each group is based on forward conversion, while the balancing operation between the two groups is based on flyback conversion, by which the magnetizing energy stored in the transformers is automatically reset without using additional demagnetizing circuits—this is also beneficial to the size and cost of the equalizer; due to the effective demagnetization and low turns ratio of the primary windings, low voltage stress on the power devices are achieved, contributing to achievement of high efficiency and low cost; energy can be transferred automatically, directly, and simultaneously from higher voltage cells at any position to lower voltage cells at any position, i.e., the any-cells-to-any-cells equalization, leading to a high balancing efficiency and speed; and the global equalization for a long battery string can be achieved through connecting the secondary sides of multi-winding transformers without using additional components for the equalization among modules, which overcomes the mismatching problem of multi windings.

Figure 18A:
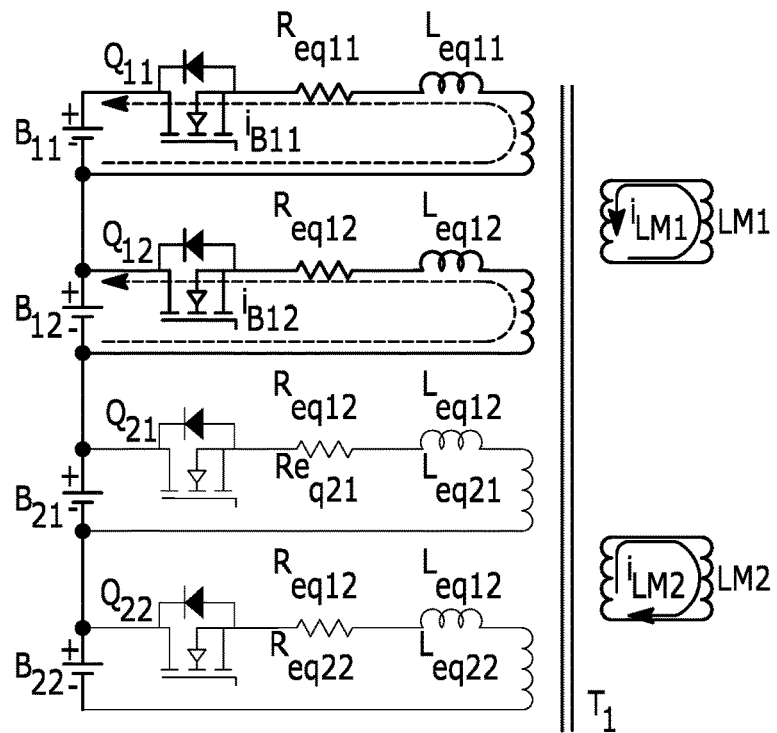
FIGS. 18($a$) and ($b$) show mode I and mode II, respectively, of an exemplary forward-flyback equalizer, according to an exemplary embodiment.
Figure 18B:
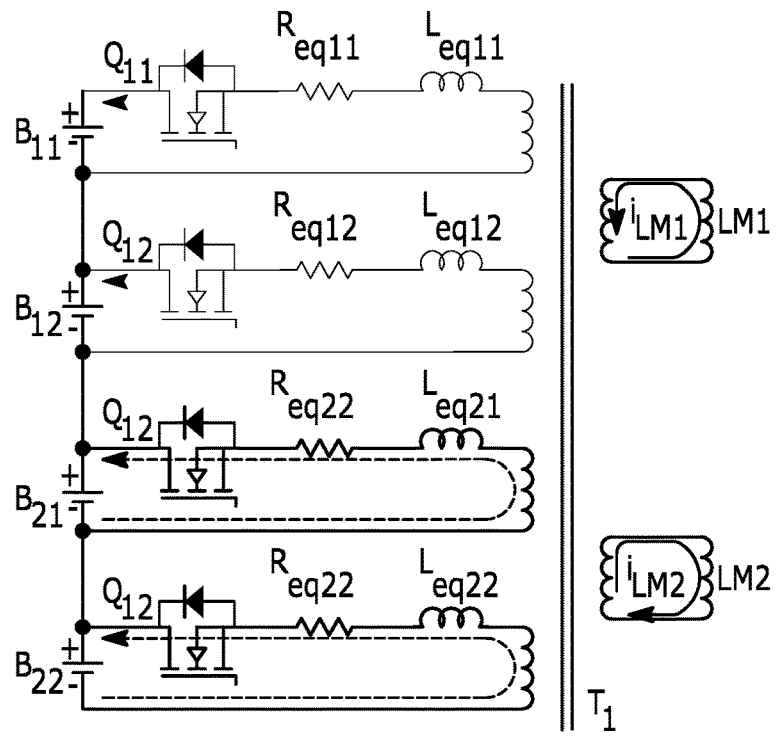
Figure 18B:
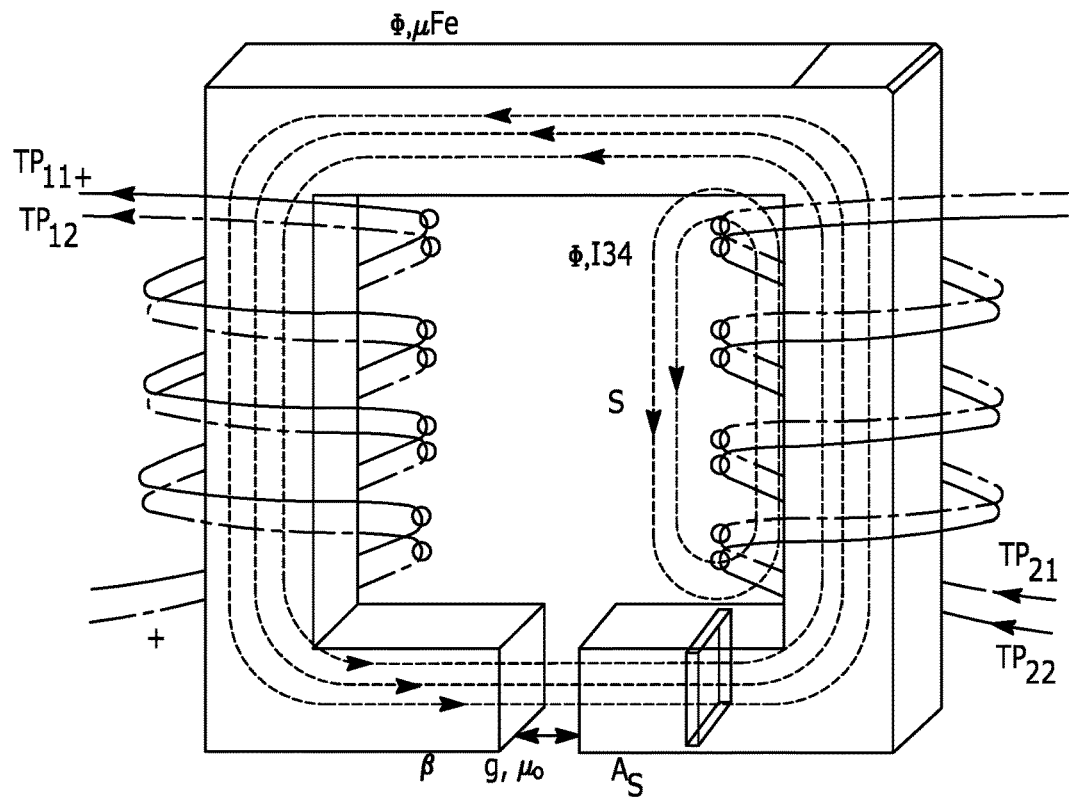

Automatic balancing among cells can be obtained by driving the MOSFET switches using one pair of complementary PWM signals. The proposed equalization works on the forward and flyback operations. The forward operation is employed to achieve the voltage equalization among cells in one group. The flyback operation is employed to achieve the voltage equalization between the two groups, and reset the magnetic energy stored in the transformer when some switches are turned off in order to simplify the analysis for the operation modes, the following assumptions can be made, according to one exemplary embodiment:

As shown in FIGS. 18(a) and 18(b), the concept can be applied to a battery string of four cells, which is modularized into two groups and each group consists of two cells. FIG. 18 shows the equivalent circuit of the disclosed equalizer. $L_{m1}$ and $L_{m2}$ represent the magnetizing inductances of Group I and Group II, respectively. $L_{eqlj}$=1, 2, j=1, 2 represents the leakage inductances on a primary winding. $L_{eq1j}$, i=1, 2, j=1, 2 represents the equivalent resistance on a primary winding. Thus, the transformer Ti can be sees as an ideal transformer. A PWM signal PWM+ is applied to all switches in Group I, and the complementary PWM signal PWM- is applied to all switches in Group II. The relationship among the battery cell voltages can be considered, for example, $V_{B22}>V_{B21}>V_{B12}>V_{B11}$. The windings in each group have the same turns number due to the forward operation for each group. N1 is the turns number of the primary windings of Group I, and N2 is the turns number of the primary windings of Group II. In various embodiments, the current flowing into a battery cell is positive, otherwise is negative. In the steady state, the proposed equalizer has two operating modes during one switching period, i.e., Mode I and Mode II.

Mode I (t0-t1): At t0, Switches in Group II and are Turned Off, and Switches in Group I and are Turned on Simultaneously As shown in FIG. 18 (a), the balancing currents iii the primary sides of Group II drop to zero instantaneously at t0. According to Faraday's Law, the balancing currents in the primary sides of Group I are built up to keep the magnetic flux in constant, which resets automatically the magnetization energy in Group II, reducing dv/dt of MOSFETs $Q_{21}$ and $Q_{22}$.

Figure 19A:
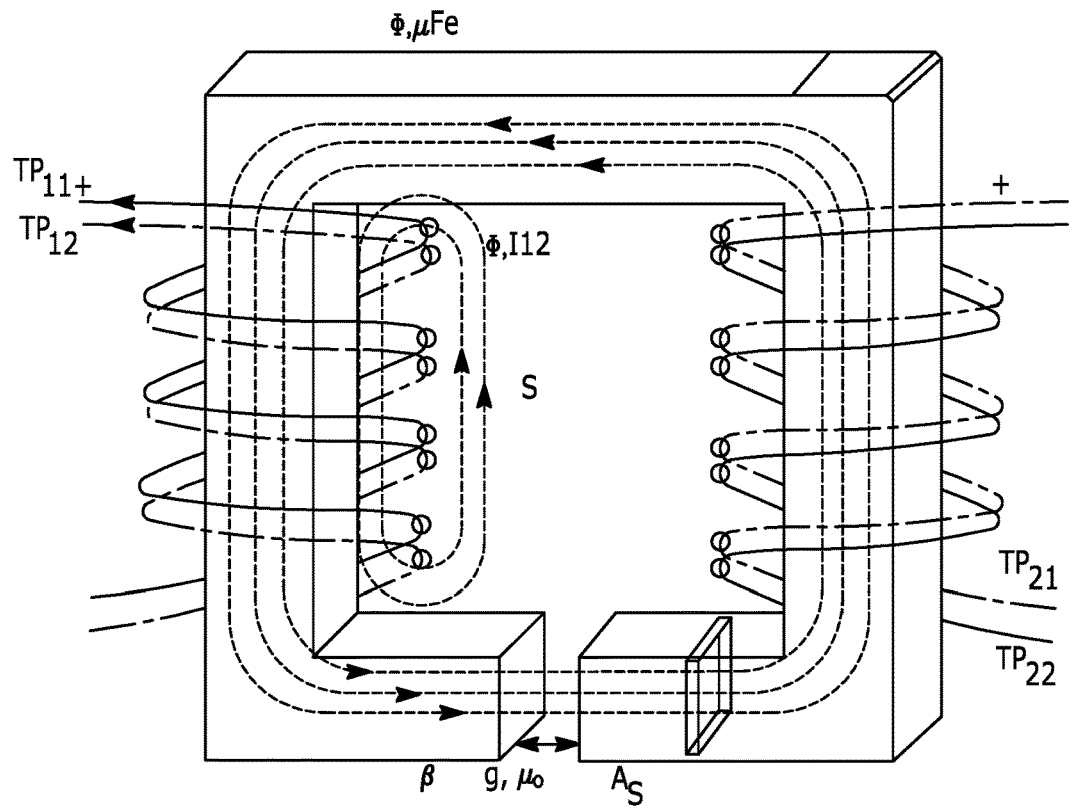
FIGS. 19($a$) and ($b$) show exemplary magnetic flux analysis of mode I and mode II, respectively, of an exemplary forward-flyback equalizer, according to an exemplary embodiment.

As shown in FIG. 19 (a), the magnetic flux continues to flow counterclockwise, which means the energy stored in the transformer during last mode is transferred to Group I through the flyback converter, achieving the voltage equalization between the two groups.

According to Ampere's law, the magnetic flux can be expressed as $$\Phi = B \cdot A_S \approx \frac{\mu_0 A_S}{g} N_1 (i_{B11} + i_{B12}), \quad (33)$$

where g is the length of the air gap. B is flux density. $\mu_0$ is the permeability of the air gap. As is the cross-sectional area of the magnetic core. NI is the ampere-turn (or magneto motive force).

At $t_0$, the magnetic flux in the transformer is expressed as $$\Phi(t_0) = \frac{\mu_0 A_S}{g} N_1 \{i_{B11}(t_0) + i_{B12}(t_0)\} = \frac{\mu_0 A_S}{g} N_2 \{i_{B21}(t_2) + i_{B22}(t_2)\}. \quad (34)$$

Thus, the initial balancing currents in the primary sides of Group I are achieved by $$i_{B11}(t_0) + i_{B12}(t_0) = \frac{N_2}{N_1} \{i_{B21}(t_2) + i_{B22}(t_2)\}. \quad (35)$$

The flux linkages of the primary windings of Group I can be expressed as $$\lambda_{11} = N_1 \Phi = \frac{\mu_0 A_S}{g} N_1^2 (i_{B11} + i_{B12}) = L_{m1}(i_{B11} + i_{B21}), \quad (36)$$

$$\lambda_{12} = N_1 \Phi = \frac{\mu_0 A_S}{g} N_1^2 (i_{B11} + i_{B12}) = L_{m1}(i_{B11} + i_{B12}), \quad (37)$$

where $L_{m1}$ is given by $$L_{m1} = \frac{\mu_0 A_S}{g} N_1^2, \quad (38)$$

Eq. (38) shows the magnetizing inductance is inversely proportional to the air gap.

Based on Faraday's law, the terminal voltages of the primary windings of Group I during Mode I are calculated as $$V_{TP11}(I) = \frac{d\lambda_{11}}{dt} = L_{m1}\left(\frac{di_{B11}}{dt} + \frac{di_{B12}}{dt}\right) = \frac{d\lambda_{12}}{dt} = V_{TP12}(I), \quad (39)$$

Eq. (39) shows the identical primary voltages will bring the cell voltages to the average value based on forward conversion.

As shown in FIG. 18 (a), the charging currents for $B_{11}$ and $B_{12}$ can be represented as $$i_{B11}(t) = i_{B11}(t_0) - \frac{V_{B11}}{L_{m1} + L_{eq11}}(t - t_0), \quad (40)$$

$$i_{B12}(t) = i_{B12}(t_0) - \frac{V_{B12}}{L_{m1} + L_{eq12}}(t - t_0), \quad (41)$$

where $V_{B11}$ and $V_{B12}$ are the cell voltages of $B_{11}$ and $B_{12}$, respectively. Due to $V_{B12} > V_{B11}$, $i_{B12}$ is smaller than $i_{B11}$, which also proves the voltage equalization between $B_{11}$ and $B_{12}$ can be achieved by the forward transformer.

The balancing between the two groups is based on flyback conversion. Due to $V_{G1} < V_{G2}$, energy is transferred from Group II to Group I. The relationship between the primary voltages of the two groups is determined by:

$$\frac{V_{TP2}(II)}{V_{TP1}(I)} = \frac{N_2}{N_1} \frac{D}{1-D}, \quad (42)$$

where D is the duty cycle for Group I. $V_{TP1}(I)$ represents the uniform primary voltage of Group I during Mode I. $V_{TP2}(II)$ represents the uniform primary voltage of Group II during Mode II. $V_{TP1}(I)$ and $V_{TP2}(II)$ can be given by $$V_{TP1}(I) = V_{TP11}(I) = V_{TP12}(I), V_{TP2}(II) = V_{TP21}(II) = V_{TP22}(II). \quad (43)$$

Eq. (42) can be deduced as $$D = \frac{N_1 V_{TP2}(II)}{N_1 V_{TP2}(II) + N_2 V_{TP1}(I)}. \quad (44)$$

In order to achieve the voltage equalization for the battery string, the primary voltages of Group I and Group II should satisfy $$V_{TP1}(I) = V_{TP2}(II) = V_{avg}, \quad (45)$$

where $V_{ag}$ is the average voltage of the battery string,

By Eqs. (44) and (45), the duty cycle D can be obtained as $$D = \frac{N_1}{N_1 + N_2}. \quad (46)$$

The magnetizing currents $i_{Lm1}$ and $i_{Lm2}$ are expressed as $$i_{Lm1}(i) = i_{Lm1}(t_0) - \frac{V_{avg}}{L_{m1}}(t - t_0), \quad (47)$$

$$i_{Lm2}(i) = i_{Lm2}(t_0) - \frac{N_2 V_{avg}}{N_1 L_{m2}}(t - t_0). \quad (48)$$

The relationship among the magnetizing currents and the balancing currents in the primary windings of Group I can be expressed as follows $$i_{Lm1} + \frac{N_2}{N_1} i_{Lm2} = i_{B11} + i_{B12}. \quad (49)$$

One particular function of this mode is to balance the cell voltages of Group I, deliver the energy stored in the magnetizing inductors $L_{m1}$ and $L_{m2}$ to Group I, and achieve the demagnetization of the second group when the switches $Q_{21}$ and $Q_{22}$ are turned off.

Mode II ($t_1$-$t_2$): At $t_1$, Switches in Group I $Q_{11}$ and $Q_{12}$ are Turned Off, and Switches in Group II $Q_{21}$ and $Q_{22}$ are Turned on Simultaneously.

As shown in FIG. 18 (b), the balancing currents in the primary sides of Group drop to zero instantaneously at $t_1$. According to Faraday's Law, the balancing currents in the primary sides of Group II are built up to keep the magnetic flux in constant, which resets automatically the magnetizing energy stored in Group I, reducing dv/dt of MOSFETs $Q_{11}$ and $Q_{12}$. As shown in FIG. 19 (b), the magnetic flux flows counterclockwise, which means the energy of Group II is stored in the transformer.

The mathematical derivation of Mode II is similar to Model I. The initial currents in the primary sides of Group II can be expressed as $$i_{B21}(t_1) + i_{B22}(t_1) = \frac{N_1}{N_2}\{i_{B11}(t_1) + i_{B12}(t_1)\}. \quad (50)$$

The terminal voltages of the primary windings of Group II during Mode II are calculated as $$V_{TP21}(II) = \frac{d\lambda_{21}}{dt} = L_{m2}\left(\frac{di_{B21}}{dt} + \frac{di_{B22}}{dt}\right) = \frac{d\lambda_{22}}{dt} = V_{TP22}(II). \quad (51)$$

The discharging currents from $B_{21}$ and $B_{22}$ are given by $$i_{B21}(t) = i_{B21}(t_1) - \frac{V_{B21}}{L_{m2} + L_{eq21}}(t - t_1), \quad (52)$$

$$i_{B22}(t) = i_{B22}(t_1) - \frac{V_{B22}}{L_{m2} + L_{eq22}}(t - t_1), \quad (53)$$

where $V_{B21}$ and $V_{B22}$ are the cell voltages of $B_{21}$ and $B_{22}$, respectively. Due to $V_{B22} > V_{B21}$, $i_{B21}$ is smaller than $i_{B22}$, which also proves the voltage equalization between $B_{21}$ and $B_{22}$ is achieved through the forward transformer.

The magnetizing currents $i_{Lm1}$ and $i_{Lm2}$ are expressed as $$i_{Lm1}(t) = i_{Lm1}(t_1) - \frac{N_1 V_{avg}}{N_2 L_{m1}}(t - t_1), \quad (54)$$

$$i_{Lm2}(t) = i_{Lm2}(t_1) + \frac{V_{avg}}{L_{m2}}(t - t_1). \quad (55)$$

The relationship among the magnetizing currents and the balancing currents in Group II can be represented as $$-i_{B21} - i_{B21} = \frac{N_1}{N_2}i_{Lm1} + i_{Lm2}. \quad (56)$$

A particular function of this mode is to balance the cell voltages in Group II, deliver energy of the cells in Group II into the magnetizing inductors $L_{m1}$ and $L_{m2}$, and achieve the demagnetization of the first group when the switches $Q_{11}$ and $Q_{12}$ are turned off.

According to the above operating modes, the magnetizing currents $i_{Lm1}$ and $i_{Lm2}$ can flow naturally between the two groups without the requirement of additional demagnetizing circuits, by which the effective balancing among all cells can be achieved.

Figure 20:
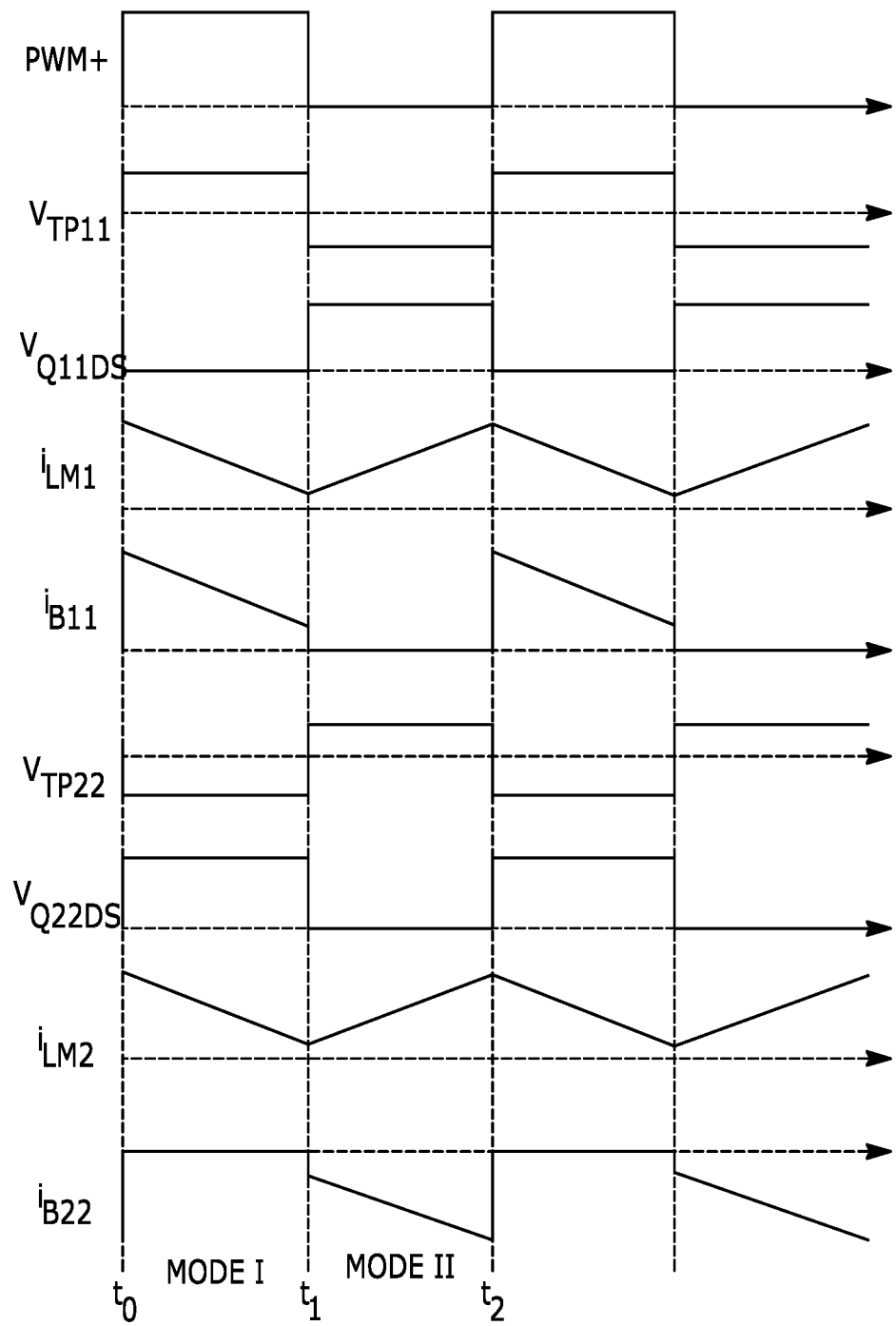
FIG. 20 shows exemplary pulse width modulation, voltages and currents waveforms of an exemplary equalizer, according to an exemplary embodiment.

FIG. 20 shows theoretical waveforms for Group I and Group II at a theoretical frequency. All of the switches in Group I are driven by PWM+, and all of the switches in Group II are driven by the complementary signal PWM-, Since the voltage of Group II $V_{G2}$ is higher than the voltage of Group I $V_{G1}$, energy is automatically transferred from Group II to Group I. When the MOSFETs $Q_{11}$-$Q_{12}$ are turned on, $i_{B11}$ flows from the multi-winding transformer $B_{11}$. Due to the agnetic energy stored in the multi-winding transformer during the last mode, $i_{B11}$, increases rapidly and then decreases linearly. When the MOSFET switch $Q_{11}$ is turned off, the maximum voltage stress on $Q_{11}$ may not exceed a predetermined voltage threshold, even in the voltage spikes, greatly reducing dv/dt of the MOSFETs. This shows that the effective demagnetization for Group I is achieved when switches $Q_{11}$-$Q_{12}$ are turned off.

Figure 21:
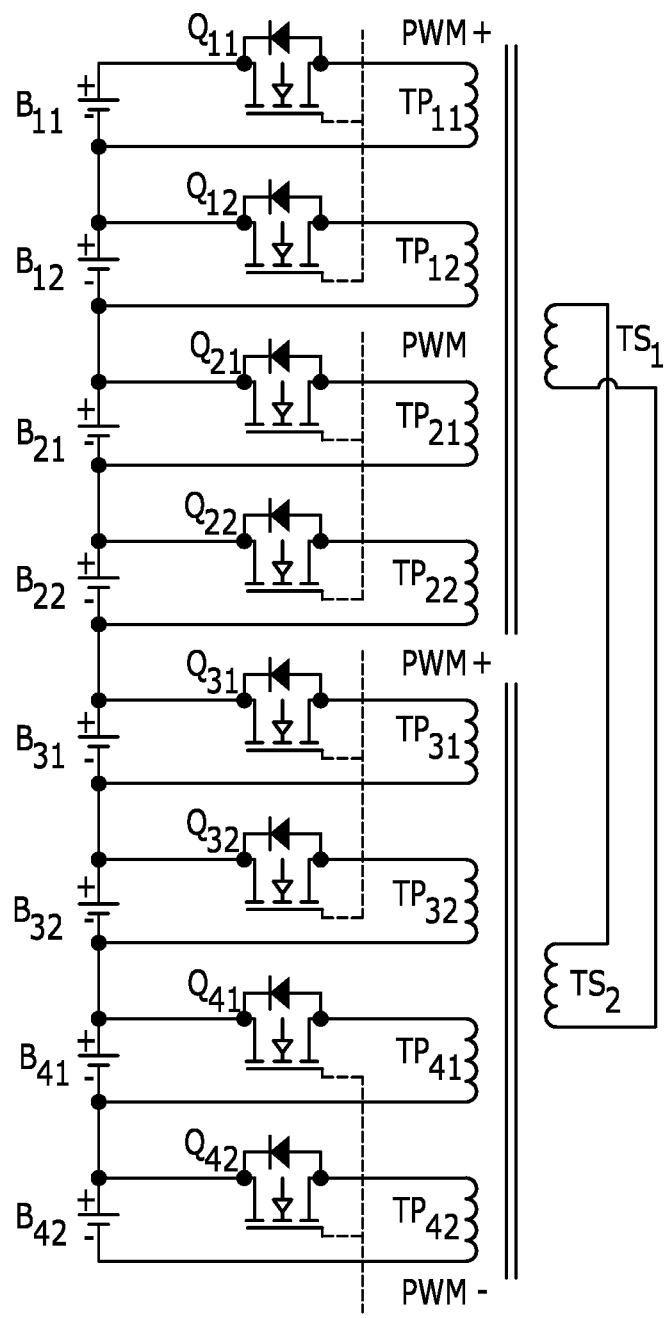
FIG. 21 shows exemplary modularized structures of an exemplary equalizer for a battery string of eight cells, according to an exemplary embodiment.

FIG. 21 shows an exemplary modularization method of the disclosed equalizers applied to an eight-cell series-connected battery string, which is divided into two separate four-cell modules. Of course, the length of this battery string is for exemplary purposed, and other lengths could be similarly employed. The equalization between modules is achieved through connecting the secondary sides of the two transformers. Contrary to the conventional modularized equalizers using additional components for the equalization among modules, the disclosed modularization method shares a single equalizer for the equalization among cells and modules, leading to smaller size, lower cost, d reduced loss with respect to the modularization. This modularization method also overcomes the mismatching problem of multi windings.

It may be noted that design parameters of the transformer include of the duty cycle D, turns ratio N, switch frequency f, magnetizing inductance $L_m$, and air gap g.

(1) Duty Cycle D

It can be assumed, for example, that the input voltage $V_{inmax}$ is 4.2V, the output voltage $V_{omin}$ is 3V, the peak equalizing current $I_{peak}$<1A, and the switching frequency is set for 15 kHz. To prevent a reverse current flow from the weak cell to the transformer, the flyback converter should be operated in continuous current mode, thereby the duty cycle D meeting $$\begin{cases} DT\frac{V_{inmax}}{L_m + L_{eq}} - (1-D)T\frac{V_{omin}}{L_m + L_{eq}} \geq 0 \\ (1-D)T\frac{V_{inmax}}{L_m + L_{eq}} - DT\frac{V_{omin}}{L_m + L_{eq}} \geq 0 \end{cases}, \quad (57)$$

By solving Eq. (57), the duty cycle D can be derived as $$41.7\% \leq D \leq 58.3\%. \quad (58)$$

Due to the complementary structure of the transformer, the desired duty cycle is 50%, according to exemplary embodiments.

(2) Turns Ratio N

According to Eq. (46), with D=50%, the turns ratio is calculated as $$N = N_1:N_2 = 1:1. \quad (59)$$

(3) Magnetizing Inductance $L_m$

To make full use of the energy of the transformer and prevent the core saturation, the peak discharging current during any mode may be limited to −1A, according to an example. Moreover, it can be assumed that the initial discharge current in each switching cycle $i_0$ is −0.1A. According to Eq. (55), the magnetizing inductance of the multi-winding transformer can be obtained as follows $$L_m \geq \frac{V_{in\,max}}{i_0 - i_{peak}} DT = 155.5 \ \mu H. \tag{60}$$

In fact, a large magnetizing inductance may weaken the effect of flyback conversion and enhance the effect of forward conversion, resulting in a reduction in the balancing performance. Thus, according to an exemplary embodiment, magnetizing inductance can be set as the marginal value of 155.5 μH.

(4) Air Gap g

The disclosed equalizer merges the flyback and forward converters through a common transformer. The forward converter does not rely on energy storage, thereby, does not need air gap in the transformer. Nevertheless, the flyback converter stores energy in the transformer before transferring to the output of the converter, which needs air gap. Therefore, air gap should be carefully designed while considering the trade-off between the forward conversion and flyback conversion. According to Eqs. (38) and (60), a exemplary air gap can be achieved by $$g \leq N_1 \frac{\mu_0 A_S}{L_m}. \tag{61}$$

The foregoing features described herein provide systems, apparatus and methods for battery pack management, including automatically detecting faults (e.g., short circuits) in battery cells within a battery pack. Moreover, automatic equalizing between cells, even in a battery string, is provided with high efficiency, easy of control, low voltage stress on MOSFETs, small size, and low cost. In addition, methods described herein are easily modularized and not limited to the numbers of the battery cells in modules. Since this topology requires a minimum number of passive components and has outstanding balancing performances, it promises to solve the dilemmas of battery equalizers applied to a long series-connected battery string to be used in electric vehicles, Methods described herein may be implemented as software and executed by a general purpose computer. For example, such a general purpose computer may include a control unit/controller or central processing unit ("CPU"), coupled with memory, EPROM, and control hardware. The CPU may be a programmable processor configured to control the operation of the computer and its components. For example, CPU may be a microcontroller ("MCU"), a general purpose hardware processor, a digital signal processor ("DSP"), application specific integrated circuit ("ARC"), field programmable gate array ("FPGA") or other programmable logic device, discrete gate or transistor logic, discrete hardware components, or any combination thereof designed to perform the functions described herein. A general-purpose processor can be a microprocessor, but in the alternative, the processor can be any processor, controller, or microcontroller. A processor can also be implemented as a combination of computing devices, for example, a combination of a DSP and a microprocessor, a plurality of microprocessors, one or more microprocessors in conjunction with a DSP core, or any other such configuration. Such operations, for example, may be stored and/or executed by memory unit.

While not specifically shown, the general computer may include additional hardware and software typical of computer systems (e.g., power, cooling, operating system) is desired. In other implementations, different configurations of a computer can be used (e.g., different bus or storage configurations or a multi-processor configuration). Some implementations include one or more computer programs executed by a programmable processor or computer. In general, each computer may include one or more processors, one or more data-storage components (e.g., volatile or non-volatile memory modules and persistent optical and magnetic storage devices, such as hard and floppy disk drives, CD-ROM drives, and magnetic tape drives), one or more input devices (e.g., mice and keyboards), and one or more output devices (e.g., display consoles and printers).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method of automatic circuit fault detection, comprising:
   inputting a common periodic wave voltage to each of a plurality of battery cells of a battery pack, in series;
   recursively calculating a correlation coefficient for each neighboring pair of the battery cells, connected in series;
   comparing each correlation coefficient with a previously calculated corresponding correlation coefficient to determine whether any of the correlation coefficients dropped; and
   if the correlation coefficients of two neighboring pairs of the battery cells drop, automatically determining that a common battery cell of both of the neighboring pairs is faulty using a communicatively coupled processor.

2. The method of claim 1, wherein the common periodic wave has an amplitude 3 times a standard deviation of a noise standard deviation, and a period smaller than a window size of the recursively calculated correlation coefficients.

3. The method of claim 2, wherein the common periodic wave is a common square wave that has an amplitude of 3 mV and a period of 2 samples.

4. The method of claim 1, wherein the recursively determining the correlation coefficients includes:
   measuring voltages output at each battery cell sequentially; and
   shifting the measured voltages in the time domain to align with corresponding previously measured voltages.

5. The method of claim 1, further comprising:
   outputting on a display the dropped correlation coefficients of the two neighboring pairs of battery cells and an indication of which battery cell is faulty.

6. The method of claim 1, wherein the battery pack is integrated within an electric vehicle.

* * * * *